United States Patent
Diest et al.

(10) Patent No.: US 11,502,240 B2
(45) Date of Patent: Nov. 15, 2022

(54) STRUCTURED ACTUATORS: SHAPED ELECTROACTIVE POLYMERS

(71) Applicant: META PLATFORMS TECHNOLOGIES, LLC, Menlo Park, CA (US)

(72) Inventors: Kenneth Diest, Kirkland, WA (US); Andrew John Ouderkirk, Redmond, MA (US); Renate Eva Klementine Landig, Seattle, WA (US); Katherine Marie Smyth, Seattle, WA (US); Spencer Allan Wells, Seattle, WA (US); Tingling Rao, Bellevue, WA (US); Sheng Ye, Redmond, WA (US); Eric Schmitt, Needham, MA (US); Nagi Elabbasi, Framingham, MA (US); Bachir Ahmed Abeid, Brighton, MA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 376 days.

(21) Appl. No.: 16/750,023

(22) Filed: Jan. 23, 2020

(65) Prior Publication Data
US 2021/0066574 A1 Mar. 4, 2021

Related U.S. Application Data

(60) Provisional application No. 62/894,626, filed on Aug. 30, 2019.

(51) Int. Cl.
*H01L 41/45* (2013.01)
*H01L 41/09* (2006.01)
(Continued)

(52) U.S. Cl.
CPC ........ *H01L 41/0986* (2013.01); *H01L 41/047* (2013.01); *H01L 41/0833* (2013.01);
(Continued)

(58) Field of Classification Search
None
See application file for complete search history.

(56) References Cited

U.S. PATENT DOCUMENTS

2011/0309716 A1* 12/2011 Jenninger ............. B32B 27/325
156/92
2014/0009039 A1   1/2014 Jenninger et al.
(Continued)

FOREIGN PATENT DOCUMENTS

WO    2020/106660 A2    5/2020

OTHER PUBLICATIONS

International Preliminary Reporton Patentability for International Application No. PCT/US2020/045510, dated Mar. 10, 2022, 7 pages.
(Continued)

*Primary Examiner* — Benjamin P Sandvik
(74) *Attorney, Agent, or Firm* — FisherBroyles, LLP

(57) ABSTRACT

An actuator assembly includes a primary electrode, a secondary electrode overlapping at least a portion of the primary electrode, and an electroactive polymer layer disposed between the primary electrode and the secondary electrode, where the electroactive polymer layer includes a non-vertical (e.g., sloped) sidewall with respect to a major surface of at least one of the electrodes. The electroactive polymer layer may be characterized by a non-axisymmetric shape with respect to an axis that is oriented orthogonal to an electrode major surface.

13 Claims, 21 Drawing Sheets

(51) Int. Cl.

| | |
|---|---|
| *H01L 41/083* | (2006.01) |
| *H01L 41/29* | (2013.01) |
| *H01L 41/047* | (2006.01) |
| *H01L 41/33* | (2013.01) |
| *H01L 41/193* | (2006.01) |

(52) U.S. Cl.
CPC .............. *H01L 41/29* (2013.01); *H01L 41/33* (2013.01); *H01L 41/45* (2013.01); *H01L 41/193* (2013.01)

(56) References Cited

U.S. PATENT DOCUMENTS

| | | | | |
|---|---|---|---|---|
| 2016/0304333 | A1* | 10/2016 | Gaudet | ................. B81B 3/0021 |
| 2018/0093456 | A1 | 4/2018 | Van Overmeere et al. | |
| 2018/0120942 | A1* | 5/2018 | Lee | ..................... G02F 1/13338 |
| 2020/0161532 | A1* | 5/2020 | Wakana | ................... B25J 9/104 |

OTHER PUBLICATIONS

Mullin et al., "Pattern Transformation Triggered by Deformation", Physical Review Letters, vol. 99, No. 8, 2007, 4 pages.

Babaee et al., "3D Soft Metamaterials with Negative Poisson's ratio", Advanced Materials, vol. 25, No. 36, 2013, 18 pages.

Bertoldi et al., "Novel negative Poisson's ratio behavior induced by an elastic instability", Advanced Materials, vol. 22, No. 3, 2010, pp. 1-11.

Overvelde et al., "Relating pore shape to the non-linear response of periodic elastomeric structures", Journal of the Mechanics and Physics of Solids, vol. 64, 2014, 16 pages.

Shen et al., "Simple cubic three-dimensional auxetic metamaterials", Physic. Status Solidi (B), vol. 251, No. 8, 2014, pp. 1515-1522.

Correa et al., "Negative Stiffiless Honeycombs for Recoverable Shock Isolation", Rapid Prototyping Journal, vol. 21, No. 2, 2015, pp. 702-713.

Coulais et al., "Discontinuous Buckling of Wide Beams and Metabeams", Physical Review Letters, vol. 115, 2015, 7 pages.

Bickel et al., "Design and Fabrication of Materials with Desired Deformation Behavior", ACM Transactions on Graphics (TOG), vol. 29, No. 4, Jul. 2010, 10 pages.

Rosset et al., "Small, fast, and tough: Shrinking down integrated elastomer transducers", Applied Physics Reviews, vol. 3, No. 3, 2016, pp. 1-27.

Plante et al., "Large-scale failure modes of dielectric elastomer actuators", International Journal of Solids and Structures, vol. 43, 2006, pp. 7727-7751.

"Optotune DEAPs", Electroactive polymers, URL: https://www.optotune.com/technology/electroactive-polymers, 2019, 3 pages.

Product—Novasentis, "EMP Haptic Actuators For Sensory Innovation", URL: https://www.novasentis.com/product, 2019, 4 pages.

Rosset et al., "Mechanical characterization of a dielectric elastomer microactuator with ion-implanted electrodes", Sensor and Actuators A 144, 2008, 25 pages.

Gerratt et al., "Dielectric breakdown of PDMS thin films", Journal of Micromechanics and Microengineering, vol. 23, Apr. 26, 2013, 8 pages.

Hunt et al., "A self-healing dielectric elastomer actuator", Applied Physics Letters, vol. 104, 2014, 4 pages.

Skov et al., "Optimization Techniques for Improving the Performance of Silicone-Based Dielectric Elastomers", Advanced Engineering Materials, vol. 20, 2018, pp. 1-21.

Mazurek et al., "Glycerol as high-permittivity liquid filler in dielectric silicone elastomers", Journal of Applied Polymer Science, vol. 133, No. 43, 2016, 28 pages.

Rao et al., "Synthesis of flexible silica aerogels using methyltrimethoxysilane (MTMS) precursor", Journal of Colloid and Interface Science, vol. 300, 2006, pp. 279-285.

Seo et al., "Reticulated Nanoporous Polymers by Controlled Polymerization-Induced Microphase Separation", Science, vol. 336, Jun. 15, 2012, 5 pages.

Jennings, S.G., "The mean free path in air", Journal of Aerosol Science, vol. 19, No. 2, 1988, pp. 1-2.

Gupta et al., "Nanoemulsions: formation, properties and applications", Soft Matter, 2016, 16 pages.

Helgeson et al., "Mesoporous organohydrogels from thermogelling photocrosslinkable nanoemulsions", Nature Materials, vol. 11, Apr. 2012, pp. 344-352.

Guha et al., "Creating nanoscale emulsions using condensation", Nature Communications, 8:1371, 2017, pp. 1-7.

Meier et al., "Microemulsion elastomers", Colloid Polymer Science, vol. 274, 1996, pp. 218-226.

Richter et al., "Design considerations of form birefringent microstructures", Applied Optics, vol. 34, No. 14, May 10, 1995, pp. 2421-2429.

Mahadik et al., "Elastic and Superhydrophobic Monolithic Methyltrimethyoxysilane-based Silica Aerogels by Two-step sol-gel process", Journal Microelectron, vol. 23, No. 1, 2016, pp. 35-39.

The University of Utah, "Adaptive Glasses", URL: http://tvc.utah.edu, as accessed on Mar. 13, 2018, 5 pages.

Billah et al., "Microstructure Evolution and Electrical Characterization of Lanthanum doped Barium Titanate (BaTiO3) Ceramics", AIP Conference Proceedings, vol. 1754, Issue 1, Jul. 12, 2016, pp. 030006-1-030006-7.

Cao et al., "Grain Size and Domain Size Relations in Bulk Ceramic Ferroelectric Materials", J. Phys. Chem Solids, vol. 57, No. 10, 1996, pp. 1499-1505.

Ding et al., "Surface profiling of an aspherical liquid lens with a varied thickness membrane", Optics Express, vol. 25, No. 4, Feb. 6, 2017, pp. 3122-3132.

He et al., "Linear Electro-Optic Properties of Orthorhombic PZN-8%PT Single Crystal", IEEE Transactions on Ultrasonics, Ferroelectrics, and Frequency Control, vol. 58, No. 6, Jun. 1, 2011, pp. 1118-1121.

Knapp, Kap, "Understanding Zirconia Crown Esthetics and Optical Properties", URL: http://glidewelldental.com/education/inclusive-dental-implant-magazine-volume-2-issue-4/, vol. 2, Issue 4, as accessed on Jun. 12, 2018, pp. 1-17.

Optotune, "Focus tunable lenses", URL: http://www.optotune.com/technology/focus-tunable-lenses, as accessed on Mar. 13, 2018, pp. 1-2.

"PoLight AS—Technology & Products—How does it work", URL: http://www.polight.com/technology-and-products/how-does-it-work/default.aspx, as accessed on Mar. 13, 2018, pp. 1-3.

Adlens, "Adjustable Lens Glasses: How They Work", URL: https://adlens.com/how-it-works/, as accessed on Mar. 28, 2018, pp. 1-9.

Piceramic, "Highly Reliable Multilayer Piezo Actuators", URL: https://www.piceramic.com/en/piezo-technology/picma/, Piezo-Technology, as accessed on Mar. 14, 2018, pp. 1-8.

Piceramic, "Displacement Modes of Piezoelectric Actuators", URL: https://www.piceramic.com/en/piezo-technology/properties-piezo-actuators/displacement-modes/, Piezo-Technology, as accessed on Mar. 14, 2018, pp. 1-12.

Jiang et al., "Transparent Electro-Optic Ceramics and Devices", Optoelectronic devices and integration, Pts 1 and 2, SPIE—Int Soc Optical Engineering, Jan. 17, 2005, 15 pages.

Keplinger et al., "Stretchable, Transparent, Ionic Conductors", Science Magazine, vol. 341, Aug. 30, 2013, pp. 984-987.

Kong et al., "Chapter 2: Transparent Ceramics", Topics in Mining, Metallurgy, and Materials Engineering, Transparent Ceramic Materials, 2015, pp. 29-91.

Patra et al., "Comparison on Optical Properties of Pure and Doped Lithium Tetraborate Single Crystals and Glasses, Solid State Physics", Proceedings of the 56th DAE Solid State Physics Symposium, AIP Conference Proceedings, vol. 1447, Issue 1, Jun. 2012, pp. 1335-1336.

Riegler et al., "Index Matching Silicone for High Brightness LED Packaging", Nusil, IMAPS International Conference on Device Packaging Mar. 13-16, 2005, 17 pages.

(56) References Cited

OTHER PUBLICATIONS

Shian et al., "Tunable Lenses using Transparent Dielectric Elastomer Actuators", Optics Express, vol. 21, No. 7, Apr. 2, 2013, pp. 8669-8676.
Hocking, L.M., "The effect of slip on the motion of a sphere close to a wall and of two adjacent spheres", Journal of Engineering Mathematics, vol. 7, No. 3, Jul. 1, 1973, pp. 207-221.
Wang et al., "A highly stretchable, transparent, and conductive polymer", Science Advances, 3:e1602076, Mar. 10, 2017, pp. 1-10.
AmericanPiezo, "New Materials", URL: www.americanpiezo.com/knowledge-center/piezo-theory/new-materials/html, as accessed on Mar. 15, 2018, 1 page.
Zhao et al., "Spherical aberration free liquid-filled tunable lens with variable thickness membrane", Optics Express, vol. 23, No. 16. Aug. 5, 2015, pp. 21264-21278.
Senseg Ltd, "Elastomeric Film Actuator (ELFIAC): A flexible, universal actuator solution for today's and tomorrow's diverse applications", URL: www.senseg.com, 2018, 11 pages.
"Comparison of EAPs with Other Actuator Technologies", URL: https://ndeaa.jpl.nasa.gov/nasa-nde/lommas/eap/actuators-comp.pdf, as accessed on Feb. 14, 2011, 4 pages.
International Search Report and Written Opinion received for PCT Application Serial No. PCT/US2020/045510 dated Oct. 20, 2020, 8 pages.

\* cited by examiner

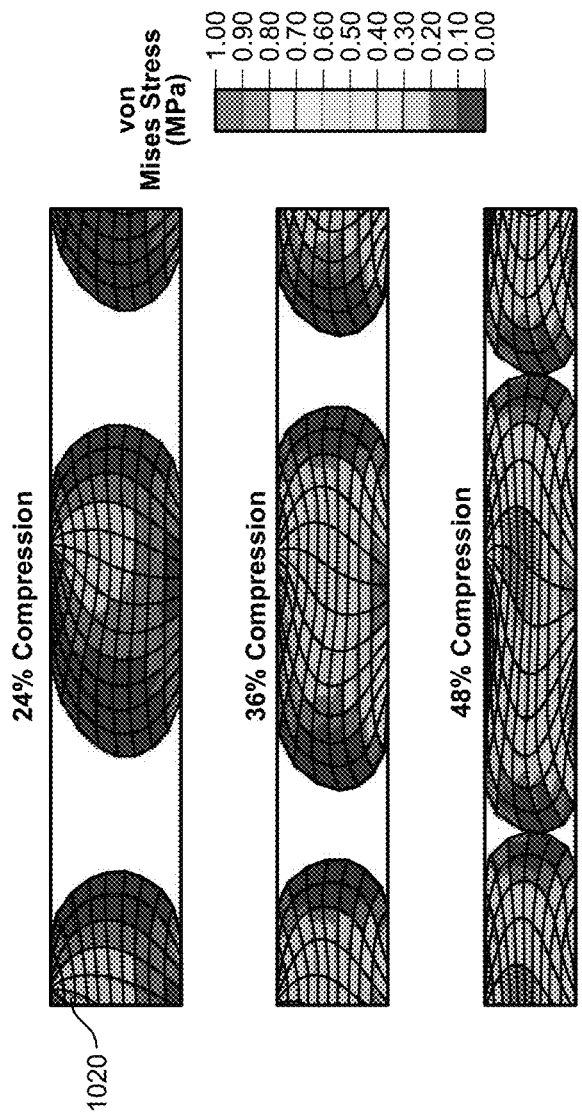
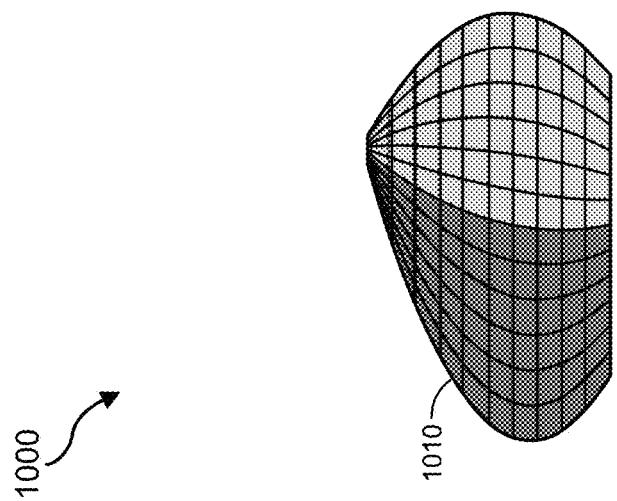
FIG. 10

STRUCTURED ACTUATORS: SHAPED ELECTROACTIVE POLYMERS

CROSS-REFERENCE TO RELATED APPLICATION

This application claims the benefit of priority under 35 U.S.C. § 119(e) of U.S. Provisional Application No. 62/894,626, filed Aug. 30, 2019, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIG. 10 shows a modeled rib/pillar design and corresponding compression performance according to some embodiments.

Figure 1:
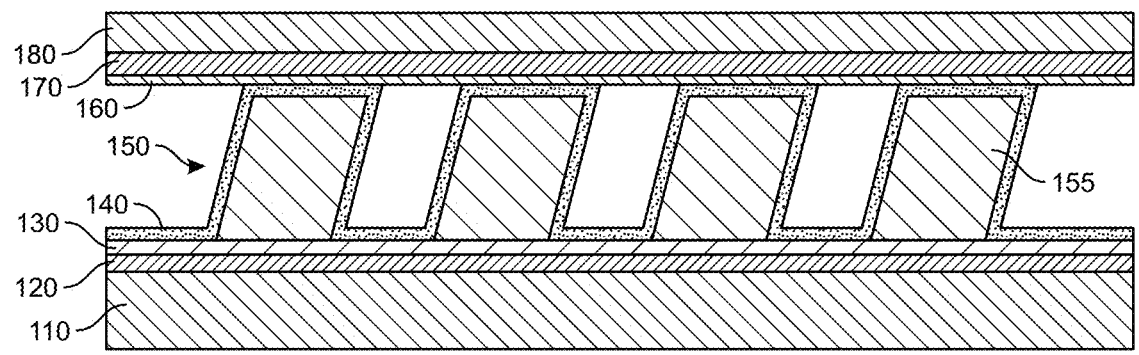
FIG. 1 is a schematic cross-sectional view of a structured actuator including a shaped electroactive polymer layer according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Disclosed herein are geometrically-structured electromechanical devices, including polymer-based actuators, that may exhibit higher levels of compression, reduced stress, and an improved voltage/displacement curve during actuation, and which may be suitable for incorporation into various system architectures. In accordance with various embodiments, the structured actuators may exhibit higher practical energy and power densities than achievable in conventional devices while avoiding an uncontrolled collapse of the polymer layer during actuation.

Polymer materials may be incorporated into a variety of different optic and electro-optic device architectures, including active and passive optics and electroactive devices. Electroactive polymer (EAP) materials, for instance, may change their shape under the influence of an electric field. EAP materials have been investigated for use in various technologies, including actuation, sensing and/or energy harvesting. Lightweight and conformable, electroactive polymers may be incorporated into wearable devices such as haptic devices and are attractive candidates for emerging technologies including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. VR/AR eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of thin film polymer materials, including the refractive index to manipulate light and/or in the example of electroactive applications, electrostatic forces to generate compression or expansion of a polymer layer between conductive electrodes.

The polymer-based actuators disclosed herein may include one or more layers of a shaped electroactive polymer disposed between conductive electrodes. In some embodiments, the electroactive response may include a mechanical response to an electrical input that varies or is constant over the spatial extent of the device, with the electrical input being applied by a control circuit to one or more of the electrodes. The mechanical response may be termed an actuation, and example devices may be, or include, actuators.

In particular embodiments, a deformable optical element and an electroactive polymer layer may be co-integrated whereby the optical element may itself be actuatable. Deformation of the electroactive polymer may be used to actuate optical elements in an optical assembly, such as a lens system. Notwithstanding recent developments, it would be advantageous to provide polymer materials and associated actuator structures having improved characteristics, including a controllable and reversible deformation response.

According to various embodiments, an actuator assembly may include a primary electrode, a secondary electrode overlapping at least a portion of the primary electrode, and a shaped electroactive polymer layer disposed between the primary electrode and the secondary electrode. The shaped electroactive polymer layer may include one or more ribs or pillars having at least one inclined sidewall such that the rib or pillar is non-axisymmetric, i.e., is non-rotationally symmetric about at least one axis.

The electroactive polymer layer may include a silicone-based polymer, for example, such as polydimethylsiloxane (PDMS). Further electroactive polymer compositions may include acrylic polymers, such as ethyl acrylate, butyl acrylate, octyl acrylate, ethoxyethoxy ethyl acrylate, chloromethyl acrylate, methacrylic acid, dimethacrylate oligomers, allyl glycidyl ether, fluorinated acrylates, cyanoacrylate or N-methylol acrylamide. Still further electroactive polymers may include polyvinylidene fluoride (PVDF) or its co-polymers such as poly(vinylidenefluoride-co-trifluoroethylene) (PVDF-TrFE)), silicone acrylate polymers, and urethane polymers, as well as combinations of the foregoing.

In certain embodiments, the electroactive polymer may include an elastomer or a thermoset polymer. Such materials may have a dielectric constant or relative permittivity, such as, for example, a dielectric constant ranging from approximately 1.2 to approximately 30 or more. The electroactive polymer layer may be shaped to provide a desired deformation response.

As used herein, a "shaped" electroactive polymer layer may, in some examples, include an asymmetric shape, such as a rib or a pillar having one or more non-rotationally symmetric sidewalls, e.g., trapezoidally-shaped pillars or ribs. As used herein, a "rib" may have disparate areal dimensions, i.e., length and width, whereas the areal dimensions of a "pillar" may be substantially equal. For instance, the length and width dimensions of a rib may vary by approximately 20% or more, while the areal dimensions of a pillar may vary by less than approximately 20%.

In some embodiments, the sidewalls of a shaped electroactive polymer layer may be planar or curved. Curved sidewalls may be concave or convex. With respect to comparative devices, structured actuators that include shaped electroactive polymer layers as disclosed herein may exhibit lower von Mises stresses during compression and a greater degree of linearity in an associated plot of voltage versus displacement.

According to some embodiments, a structured actuator may include an array of compressible ribs or pillars of an electroactive polymer located between a pair of electrodes. The ribs or pillars may be characterized by sloped sidewalls, i.e., having a tilted or non-tetrahedral shape. The ribs or pillars according to certain embodiments may include one or more sidewalls where at least a portion of each sidewall is inclined at an angle of less than 90° with respect to a major surface of at least one of the adjacent electrodes, e.g., approximately 10°, approximately 20°, approximately 30°, approximately 40°, approximately 50°, approximately 60°, approximately 70°, or approximately 80°, including ranges between any of the foregoing values. Thus, in the example of a planar sidewall, the entirety of the sidewall may be inclined at an angle of less than 90° with respect to an underlying or overlying electrode. The shaped electroactive polymer may be configured to increase its compressibility and resist electrostatic pull-in during actuation. The ribs or pillars may be arranged at different angles and/or orientations. Moreover, the rib or pillar geometry, composition, etc. may vary as a function of position within a given layer and/or across successive layers within a multi-layer stack.

In some embodiments, the electroactive polymer may have an elastic modulus of less than approximately 10 GPa (e.g., approximately 10 GPa, approximately 5 GPa, approximately 2 GPa, approximately 1 GPa, approximately 0.5 GPa, approximately 0.2 GPa, approximately 0.1 GPa, approximately 0.05 GPa, approximately 0.02 GPa, approximately 0.01 GPa, approximately 0.005 GPa, approximately 0.002 GPa, approximately 0.001 GPa, approximately 0.0005 GPa, approximately 0.0002 GPa, or approximately 0.0001 GPa, including ranges between any of the foregoing values). A layer of electroactive polymer, e.g., a shaped electroactive polymer layer, may be at least approximately 90% dense, e.g., approximately 90%, approximately 95%, approximately 97%, approximately 98%, or approximately 99% dense, including ranges between any of the foregoing values, and substantially free of voids or secondary phases.

As disclosed herein, inkjet printing may be used to form one or more layers of a shaped electroactive polymer, although other deposition and patterning methods are contemplated. For instance, deposition may include an extrusion process or a vacuum process such as chemical vapor deposition. Patterning, which may be performed in conjunction with a direct-write process such as inkjet printing or subsequent to formation of an electroactive polymer layer, may include nanoimprint lithography (e.g., imprinting and stamp printing) using a hard tool or a soft tool, stereolithography, two-photon absorption processes, lithography and etching (e.g., photolithography, electron beam lithography, grayscale lithography, etc.), microreplication techniques, focused ion beam milling, or diamond turning.

The electroactive polymer may be printed onto any suitable substrate. In some embodiments, the substrate may be transparent. Example substrate materials may include glass or polymeric compositions, which may define various optical element structures such as a lens. As disclosed herein, further example substrates may include transparent conductive layers, such as transparent conductive electrodes.

In certain embodiments, prior to printing or otherwise depositing an electroactive polymer, a substrate surface may be pre-treated or conditioned, for example, to improve the wettability or adhesion of the printed layer. Substrate pre-treatments may include one or more of a plasma treatment (e.g., $CF_4$ plasma), thermal treatment, e-beam exposure, UV exposure, UV-ozone exposure, or coating with a layer of solvent, adhesion layer, or a self-assembled monolayer. The substrate pre-treatment may increase or decrease the roughness of the substrate surface. In some embodiments, the pre-treatment may be used to form a hydrophilic surface or a hydrophobic surface.

In various embodiments, a polymer precursor composition may be deposited onto a substrate at approximately atmospheric pressure, although the deposition pressure is not particularly limited and may be conducted at reduced pressure, e.g., from approximately 1 Torr to approximately 760 Torr, e.g., 1, 2, 5, 10, 20, 50, 100, 200, 500, or 760 Torr, including ranges between any of the foregoing values.

During one or more deposition steps, the substrate temperature may be maintained at approximately room temperature (23° C.), although lesser and greater substrate temperatures may be used. For instance, the substrate temperature during formation of an electroactive polymer layer thereon may range from approximately −20° C. to approximately 100° C., e.g., −20° C., 0° C., 20° C., 40° C., 60° C., 80° C., or 100° C., including ranges between any of the foregoing values, and may be held substantially constant or varied during deposition.

A polymer precursor composition including a curable material may be printed or otherwise deposited onto a substrate to form a precursor coating on the substrate. The precursor coating may be cured to cross-link and polymerize the curable material. A curing source such as a light source or a heat source, for example, may be used to process the precursor coating and may include an energized array of filaments that may generate energy to sufficiently heat the curable material. According to some embodiments, the precursor coating thickness may range from approximately 10 nanometers to approximately 10 millimeters, e.g., approximately 10 nanometers, approximately 20 nanometers, approximately 50 nanometers, approximately 100 nanometers, approximately 200 nanometers, approximately 500 nanometers, approximately 1 micrometer, approximately 2 micrometers, approximately 5 micrometers, approximately 10 micrometers, approximately 20 micrometers, approximately 50 micrometers, approximately 100 micrometers, approximately 200 micrometers, approximately 500 micrometers, approximately 1000 micrometers, approximately 2000 micrometers, approximately 5000 micrometers, or approximately 10000 micrometers, including ranges between any of the foregoing values.

In some embodiments, polymerization may be achieved by exposing the precursor coating to heat or actinic radiation. In some examples, "actinic radiation" may refer to energy capable of breaking covalent bonds in a material. Examples may include electrons, electron beams, x-rays, gamma rays, ultraviolet and visible light, and ions at appropriately high energy levels. By way of example, a single UV lamp or a set of UV lamps may be used as a source for actinic radiation. Another source for actinic radiation may include a laser (e.g., a UV, IR, or visible laser) or light emitting diode (LED).

Additionally or alternatively, a heat source may generate heat to initiate reaction between monomers, monomer initiators, and/or cross-linking agents within a precursor coating. The monomers, monomer initiators, and/or cross-linking agents may react upon heating and/or actinic radiation exposure to form an electroactive polymer as described herein.

In some embodiments, polymerization may be free radical initiated. In such embodiments, free radical initiation may be performed by exposure to actinic radiation or heat. In addition to, or in lieu of, actinic radiation and heat-generated free radicals, polymerization of the electroactive polymer may be atom transfer radical initiated, electrochemically initiated, plasma initiated, or ultrasonically initiated, as well as combinations of the foregoing. In certain embodiments, example additives to the polymer precursor composition that may be used to induce free radical initiation include azo compounds, peroxides, and halogens.

In some embodiments, polymerization catalysts or hardeners may be used. Example polymerization catalysts, which may be incorporated into the polymer precursor composition, include hydrosilylation catalysts, metallocenes, Ziegler-Natta catalysts, peroxides, photo-initiators, polyamines, sulfur, styrenes, epoxies, isocyanates, and higher fatty acids or their esters, as well as combinations thereof.

According to some embodiments, curing of the precursor coating may be performed during the act of depositing, or curing may be performed after depositing one or more layers. For instance, heat generated by an inkjet print head may be used to at least partially cure the precursor coating in situ.

In some embodiments, the polymerization process may not be limited to a single curing step. Rather, it may be possible to carry out polymerization by two or more steps, whereby, as an example, the precursor coating may be exposed to two or more UV lamps of the same type or two or more different UV lamps in sequence. The curing temperature used for different curing steps may be the same or different. The lamp power, wavelength, and dose from different lamps may also be the same or different. In one embodiment, the polymerization may be carried out in air; however, polymerizing in an inert gas atmosphere like nitrogen or argon is also contemplated.

In various aspects, the curing time may depend on the reactivity of the precursor coating, the thickness of the precursor coating, the type of polymerization initiator and the power of a UV lamp, for example. The UV curing time may be approximately 60 minutes or less, e.g., less than 5 minutes, less than 3 minutes, or less than 1 minute. In another embodiment, short curing times of less than 30 seconds may be used for mass production.

In some embodiments, a shaped polymer structure may be created by nanoimprint lithography or using a microreplication tool. The shaped polymer structure may or may not include undercut regions. An example of an undercut region may include, for example, trapezoidal posts or ridges, and bulbous (i.e., bulging) forms having a first width adjacent to a primary electrode, a second width adjacent to a secondary opposing electrode, and an intermediate width between the primary width and the secondary width, where the intermediate width is greater than the primary width and greater than the secondary width.

In the presence of an electrostatic field (E-field), an electroactive polymer may deform (e.g., compress, elongate, bulge, stretch, bend, etc.) in relation to the magnitude and direction of the applied field. Generation of such a field may be accomplished by placing the electroactive polymer between two electrodes, e.g., a primary electrode and a secondary electrode, each of which is at a different potential. As the potential difference (i.e., voltage difference) between the electrodes is increased or decreased (e.g., from zero potential) the amount of deformation may also increase, principally along electric field lines. This deformation may achieve saturation when a certain electrostatic field strength has been reached.

The electrodes (e.g., the primary electrode and the secondary electrode) may include one or more electrically conductive materials, such as a metal, a semiconductor (e.g., a doped semiconductor), carbon nanotubes, metal nanotubes, graphene, oxidized graphene, fluorinated graphene, hydrogenated graphene, other graphene derivatives, carbon black, transparent conductive oxides (TCOs, e.g., indium tin oxide (ITO), zinc oxide (ZnO), etc.), conductive nanoparticle suspensions, or other electrically conducting materials. In some embodiments, the electrodes may include a metal such as aluminum, gold, silver, platinum, palladium, nickel, tantalum, tin, copper, indium, gallium, zinc, as well as alloys thereof. Further example transparent conductive oxides include, without limitation, aluminum-doped zinc oxide, fluorine-doped tin oxide, indium-doped cadmium oxide, indium zinc oxide, indium gallium tin oxide, indium gallium zinc oxide, indium gallium zinc tin oxide, strontium vanadate, strontium niobate, strontium molybdate, calcium molybdate, and indium zinc tin oxide.

In some embodiments, the electrodes (e.g., the primary electrode and the secondary electrode) may have a thickness of approximately 0.335 nm to approximately 1 mm, with an example thickness range of approximately 10 nm to approximately 500 nm. Some of the electrodes may be designed to allow healing of electrical breakdown (e.g., associated with the electric breakdown of elastomeric polymer materials). A thickness of an electrode that includes a self-healing or self-clearing material (e.g., a graphene electrode) may be approximately 30 nm. Such an electrode layer may be in contact with a larger or thicker electrically conductive layer.

The electrodes in some embodiments may be configured to stretch elastically. In such embodiments, the electrodes may include TCO particles, graphene, carbon nanotubes, and the like. In other embodiments, relatively rigid electrodes (e.g., electrodes including a metal such as aluminum) may be used. The electrodes, i.e., the electrode material, may be selected to achieve a desired electrical conductivity, deformability, transparency, and optical clarity for a given application. By way of example, the yield point of a deformable electrode may occur at an engineering strain of at least approximately 0.5%.

The electrodes (e.g., the primary electrode and the secondary electrode) may be fabricated using any suitable process. For example, the electrodes may be fabricated using physical vapor deposition (PVD), chemical vapor deposition (CVD), plasma enhanced chemical vapor deposition (PECVD), evaporation, spray-coating, dip-coating, spin-coating, atomic layer deposition (ALD), ink jet printing, screen printing, gravure printing, doctor blading, and the like. In another aspect, the electrodes may be manufactured using a thermal evaporator, a sputtering system, a spray coater, a spin-coater, etc.

In some embodiments, one or more electrodes may be electrically interconnected, e.g., through a contact layer, to a common electrode. In some embodiments, an electroactive device may have a first common electrode connected to a first plurality of electrodes, and a second common electrode connected to a second plurality of electrodes. In some embodiments, electrodes (e.g., one of a first plurality of electrodes and one of a second plurality of electrodes) may be electrically isolated from each other using an insulator, such as a dielectric layer. In some embodiments, a contact layer or common electrode may be shaped to allow compression and expansion of an actuator during operation.

An insulator may include a material without appreciable electrical conductivity, and may include a dielectric material, such as, for example, an acrylate or silicone polymer. In some embodiments, an electrode (or other electrical connector) may include a metal. In some embodiments, an electrode (such as an electrical contact) or an electrical connector may include a similar material to other similar components.

In some embodiments, a primary electrode may overlap (e.g., overlap in a parallel direction) at least a portion of a secondary electrode. The primary and secondary electrodes may be generally parallel and spaced apart. A tertiary electrode may overlap at least a portion of either the primary or secondary electrode. A structured actuator may include a first electroactive polymer layer (e.g., an elastomer material), which may be disposed between a first pair of electrodes (e.g., the primary and the secondary electrode). The structured actuator may further include a second electroactive polymer layer, which may be disposed between a second pair of electrodes (e.g., the primary and the tertiary electrode). In some embodiments, there may be an electrode that is common to both the first pair of electrodes and the second pair of electrodes.

The application of a voltage between the electrodes can cause compression of the intervening shaped polymer layer(s) in the direction of the applied electric field and an associated expansion or contraction of the polymer layer(s) in one or more transverse dimensions. In some embodiments, an applied voltage (e.g., to the primary electrode and/or the secondary electrode) may create at least approximately 0.01% strain (e.g., an amount of deformation in the direction of the applied force resulting from the applied voltage divided by the initial dimension of the material) in an intervening electroactive polymer layer.

In some embodiments, a common electrode may be electrically coupled (e.g., electrically contacted at an interface having a low contact resistance) to one or more other electrodes, e.g., a secondary and a tertiary electrode located on either side of a primary electrode. In some embodiments, an electroactive device may include additional electroactive polymer layers interleaved between electrodes, for example in a stacked configuration. Electrodes may form an interdigitated stack, with alternate electrodes connected to a first common electrode through a primary contact layer and the remaining alternate electrodes connected to a second common electrode through a secondary contact layer.

In some embodiments, a primary contact layer may be disposed over an end face of a primary electrode and a secondary contact layer may be disposed over an end face of a secondary electrode. Furthermore, the primary and secondary contact layers may be disposed over opposing end faces of an intervening electroactive layer, i.e., a shaped electroactive polymer layer located between the primary electrode and the secondary electrode. In an example structured actuator, one or more dimensions of the primary contact layer may be different than corresponding dimensions of the secondary contact layer. In some embodiments, for example, a cross-sectional area of the primary contact layer may be different than a cross-sectional area of the secondary contact layer.

By way of example, an actuator stack may include a primary electrode, a secondary electrode overlapping at least a portion of the primary electrode, a shaped electroactive polymer layer disposed between and abutting the primary electrode and the secondary electrode, a primary contact layer disposed over an end face of the primary electrode, and a secondary contact layer disposed over an end face of the secondary electrode.

The electroactive polymer layers disclosed herein may be incorporated into various electromechanical elements, i.e., structured actuators. According to certain embodiments, an electromechanical element may include a primary electrode, a secondary electrode overlapping at least a portion of the primary electrode, and a shaped, electroactive polymer layer disposed between and abutting the primary electrode and the secondary electrode. By way of example, an actuator assembly may include a primary electrode, a secondary electrode overlapping at least a portion of the primary electrode, and an electroactive polymer layer disposed between the primary electrode and the secondary electrode, where the electroactive polymer layer comprises a non-vertical sidewall with respect to a major surface of at least one of the electrodes.

According to various embodiments, the electrodes and the shaped electroactive polymer layer may be formed simultaneously or separately and subsequently joined. For instance, a co-extrusion process may be used to form and bond an electrode to a planar or non-planar polymer layer. According to further embodiments, a structured actuator may be formed using a lamination process.

In some embodiments, a structured actuator may be coupled to an optical element such as a tunable lens and may include an electroded layer of a shaped electroactive polymer disposed over or proximate to a surface of the tunable lens. The tunable lens may be a liquid lens, for example, and may have a geometry selected from prismatic, freeform, plano, meniscus, bi-convex, plano-convex, bi-concave, or plano-concave. In certain embodiments, a further optical element may be disposed over a second surface of the tunable lens. The optical element(s) may be incorporated into a head mounted display, e.g., within a transparent aperture thereof.

In accordance with various embodiments, liquid lenses can be used to enhance imaging system flexibility across a wide variety of applications that benefit from rapid focusing. According to certain embodiments, by integrating an actuatable liquid lens, an imaging system can rapidly change the plane of focus to provide a sharper image, independent of an object's distance from the lens. The use of liquid lenses may be particularly advantageous for applications that involve focusing at multiple distances, where objects under inspection may have different sizes or may be located at varying distances from the lens, such as package sorting, barcode reading, security, and rapid automation, in addition to virtual reality/augmented reality devices.

Further to the foregoing, actuatable electroactive polymer layers may be incorporated into a variety of passive and active optics. Example structures include tunable prisms and gratings as well as tunable form birefringent structures. In some embodiments, the optical performance of an electroactive polymer grating may be tuned through actuation of the grating, which may modify the pitch or height of the grating elements. In some embodiments, a structured actuator including a shaped electroactive polymer layer may be incorporated into an actively switchable optical waveguide or switchable Fresnel zone plate. According to some embodiments, one or more optical properties of an optical element may be tuned through capacitive actuation, mechanical actuation, and/or acoustic actuation of a shaped EAP layer.

While the shaped electroactive polymer materials and the associated structured actuators of the present disclosure are described generally in connection with passive and active optics, the electroactive polymer materials may be used in other fields. For example, the structured actuators may be used, as part of, or in combination with optical retardation films, polarizers, compensators, beam splitters, reflective films, alignment layers, color filters, antistatic protection sheets, electromagnetic interference protection sheets, polarization-controlled lenses for autostereoscopic three-dimensional displays, infrared reflection films, haptics, soft robotics, and the like.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-24, detailed descriptions of example structured actuators and the associated shaped electroactive polymer layer(s). The discussion associated with FIGS. 1-18 relates to various structured actuator configurations and fabrication methods. The discussion associated with FIGS. 19-24 relates to exemplary virtual reality and augmented reality device architectures that may include a structured actuator as disclosed herein.

Turning to FIG. 1, shown is a schematic cross-sectional view of an example structured actuator. Structured actuator 100 may include, from bottom to top, a substrate (bottom support) 110, a primary electrode 120, a polymer layer 130, a primary adhesion layer 140, a shaped electroactive polymer layer 150, a secondary adhesion layer 160, a secondary electrode 170, and a substrate (top support) 180. Shaped electroactive polymer layer 150 may include a plurality of separate slanted ribs or pillars 155 characterized by opposing non-vertical sidewalls. In certain embodiments, polymer layer 130 and shaped electroactive polymer layer 150 may be compositionally equivalent.

In some embodiments, primary adhesion layer 140 may be a conformal layer and may be formed using atomic layer deposition (ALD) or chemical vapor deposition (CVD), for example. Alternatively, primary adhesion layer 140 may be formed over exposed horizontal surfaces, i.e., top surfaces, of the ribs or pillars 155 without coating the sidewalls. Thus, a primary adhesion layer 140 may be a continuous layer or a discontinuous layer, i.e., formed only over exposed horizontal surfaces of the ribs or pillars 155.

According to some embodiments, interlayer adhesion (for example, between the primary adhesion layer 140 and the shaped electroactive polymer layer 150 or between the secondary adhesion layer 160 and the secondary electrode 170, etc.) may be improved by applying a primer layer (not shown) such as an acrylate primer. For instance, to improve adhesion via covalent bonding, an acrylate primer may be deposited using vapor or solution processing and cured prior to bonding. Alternatively, to improve adhesion via hydrogen bonding, a hydroxyl primer may be deposited using vapor or solution processing prior to bonding. In some embodiments, a corona treatment may be used to improve static interactions at the interface between bonded layers. In still further embodiments, a plasma treatment may be used to improve Van der Waals or polar-polar bonding at the bonding interface.

Figure 2:
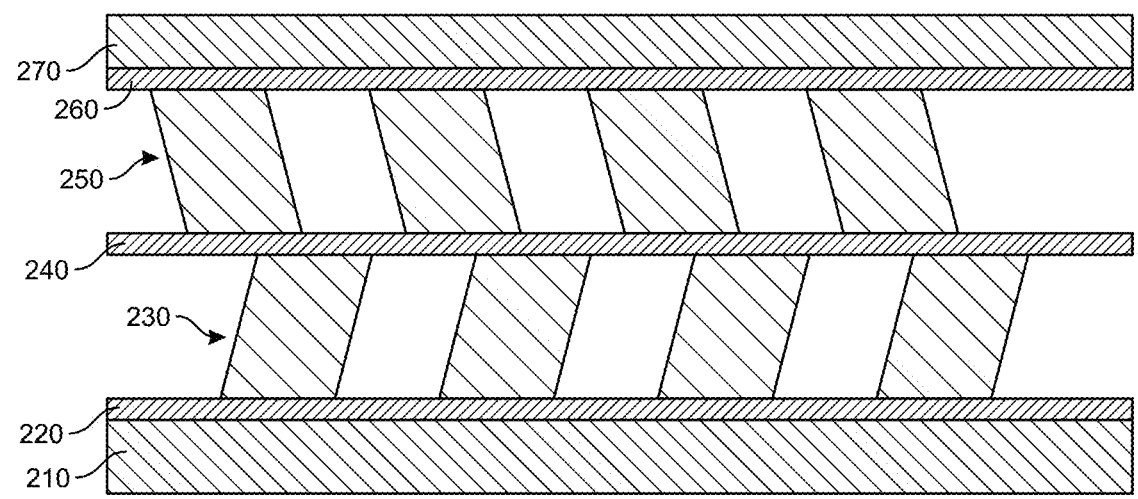
FIG. 2 is a schematic cross-sectional view of a structured actuator including a pair of shaped electroactive polymer layers according to some embodiments.

Referring to FIG. 2, shown is a schematic cross-sectional view of a multilayer structured actuator according to various embodiments. Multilayer actuator 200 may include, from bottom to top, a substrate (bottom support) 210, a primary electrode 220, a first shaped electroactive polymer layer 230, a secondary electrode 240, a second shaped electroactive polymer layer 250, a tertiary electrode 260, and a substrate (top support) 270. According to some embodiments, secondary electrode 240 may include one or more non-conductive support layers, such as a polyimide or a polyethylene thin film (not separately shown).

As will be appreciated, the slanted ribs or pillars within the first shaped electroactive polymer layer 230 may be aligned with the slanted ribs or pillars within the second shaped electroactive polymer layer 250. That is, the respective ribs or pillars in the adjacent polymer layers 230, 250 may be coextensive, may partially overlap (as illustrated), or may be laterally offset from each other.

Figure 3:
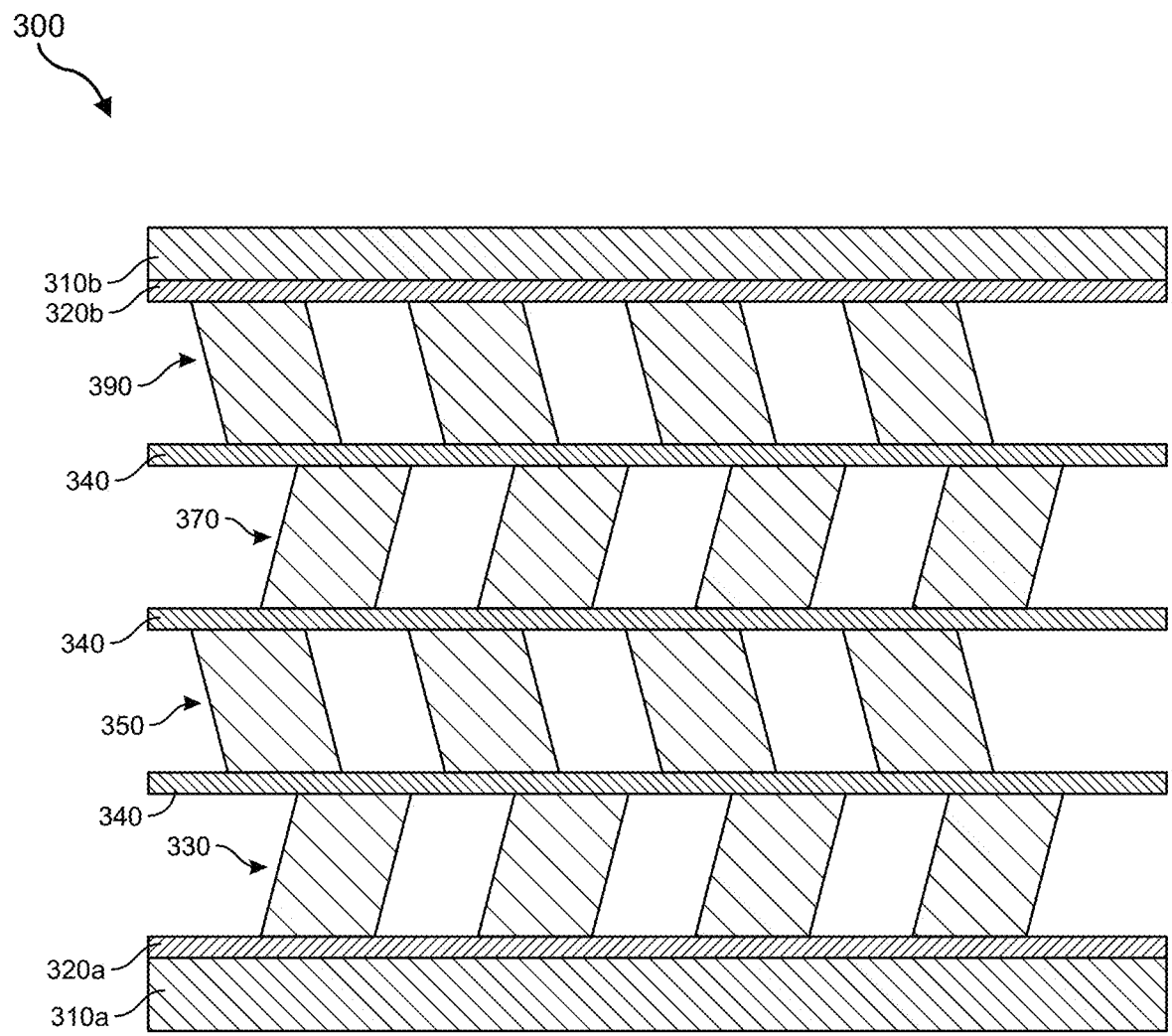
FIG. 3 is a schematic cross-sectional view of a multi-layer structured actuator including plural shaped electroactive polymer layers according to further embodiments.

A further example multilayer structured actuator is illustrated in FIG. 3. Structured actuator 300 may include, from bottom to top, a substrate (bottom support) 310a, a primary electrode 320a, a first shaped electroactive polymer layer 330, a support layer 340, a second shaped electroactive polymer layer 350, a support layer 340, a third shaped electroactive polymer layer 370, a support layer 340, a fourth shaped electroactive polymer layer 390, a secondary electrode 320b, and a substrate (top support) 310b. In some embodiments, one or more of the support layers 340 may include a conductive layer operable as an electrode.

Figure 4:
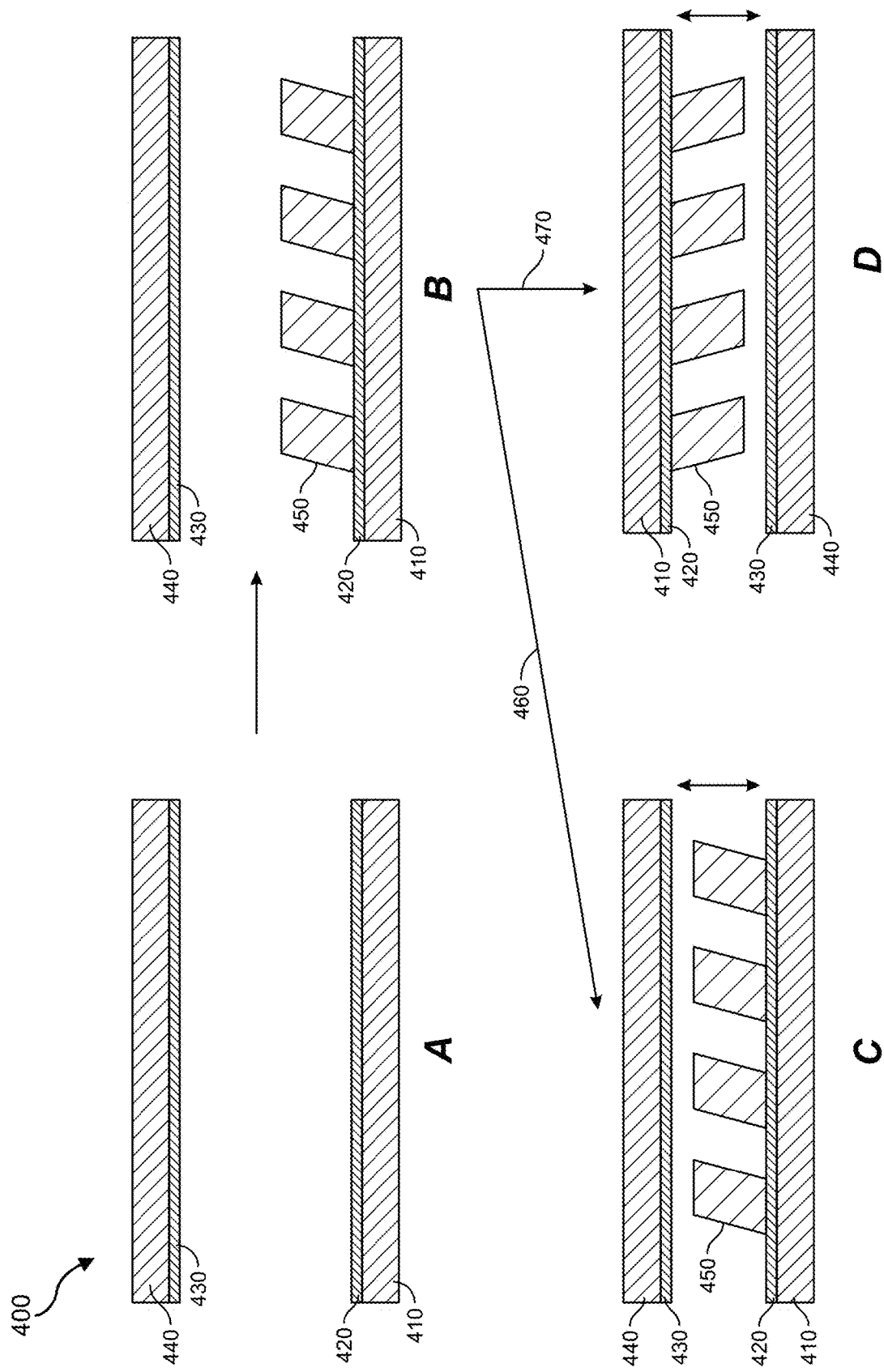
FIG. 4 illustrates example methods for forming a structured actuator including a shaped electroactive polymer layer according to certain embodiments.

Referring to FIG. 4, shown are example methods of manufacturing a structured actuator. In particular, method 400 may be used to form a single layer stack. Referring initially to FIG. 4A and FIG. 4B, in one approach, a shaped electroactive polymer layer 450 may be formed over a bottom substrate 410, i.e., directly over primary electrode 420 and, according to path 460, affixed to a top substrate 440 via secondary electrode 430 as shown in FIG. 4C. In a complimentary approach, referring to path 470 and FIG. 4D, bottom substrate 410 with shaped electroactive polymer layer 450 may be flipped and subsequently bonded to an opposing substrate 440 via secondary electrode 430. In certain embodiments, substrates 410, 440 may be suitably processed prior to the formation of, or bonding with, the shaped electroactive polymer layer 450.

Figure 5:
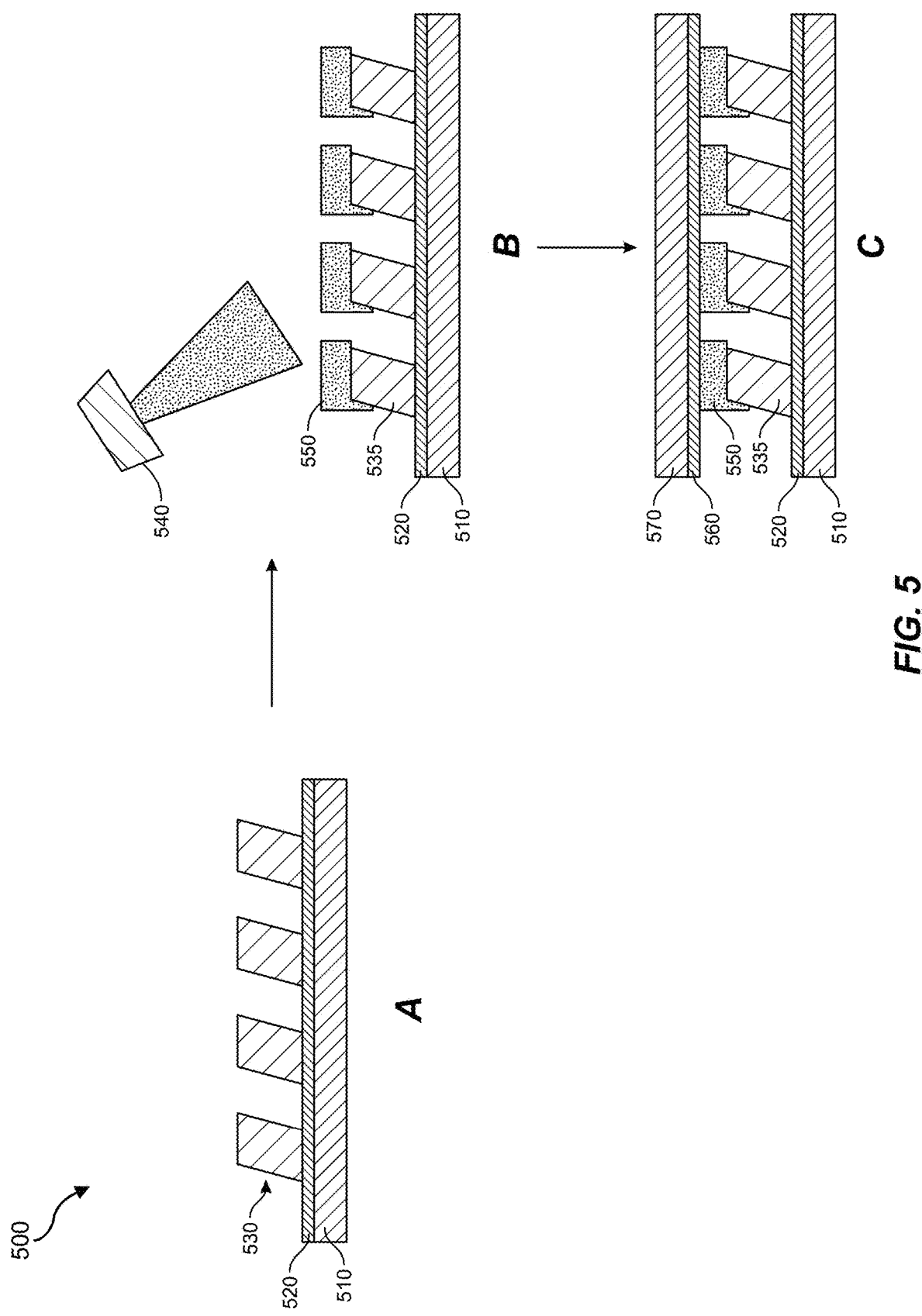
FIG. 5 illustrates an example method for forming a structured actuator including a shaped electroactive polymer layer according to further embodiments.

A further example manufacturing method is outlined in FIG. 5. Referring to FIG. 5A, method 500 may include forming a primary electrode 520 over a bottom substrate 510 and forming a shaped electroactive polymer layer 530 over the primary electrode 520. Referring to FIG. 5B, using an angled deposition process 540, a layer of conductive material 550 may be formed over the tops of ribs or pillars 535. Subsequently, as illustrated in FIG. 5C, a top substrate 570 including a secondary electrode 560 may be contacted with the modified electroactive polymer layer 530, i.e., via the layer of conductive material 550. As will be appreciated, the layer of conductive material 550 may increase the spacing between the primary electrode 520 and the secondary electrode 560 in regions between the ribs or pillars 535 and thus decrease the propensity for polymer pull-in or electrical shorting between the electrodes.

Figure 6:
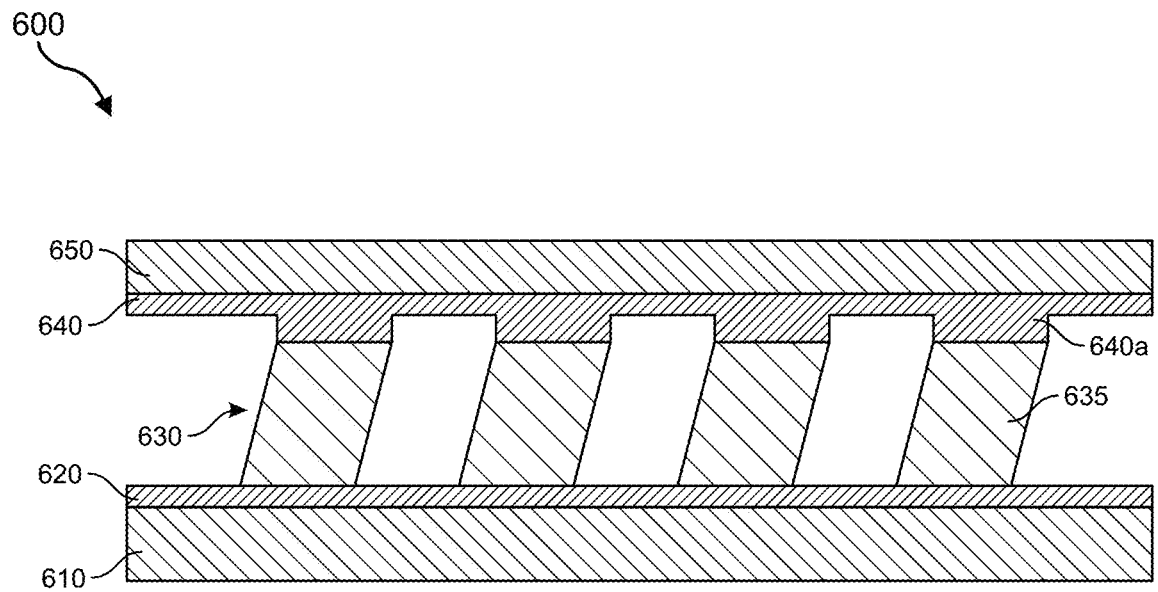
FIG. 6 illustrates a further example method for forming a structured actuator including a shaped electroactive polymer layer according to some embodiments.
Figure 7:
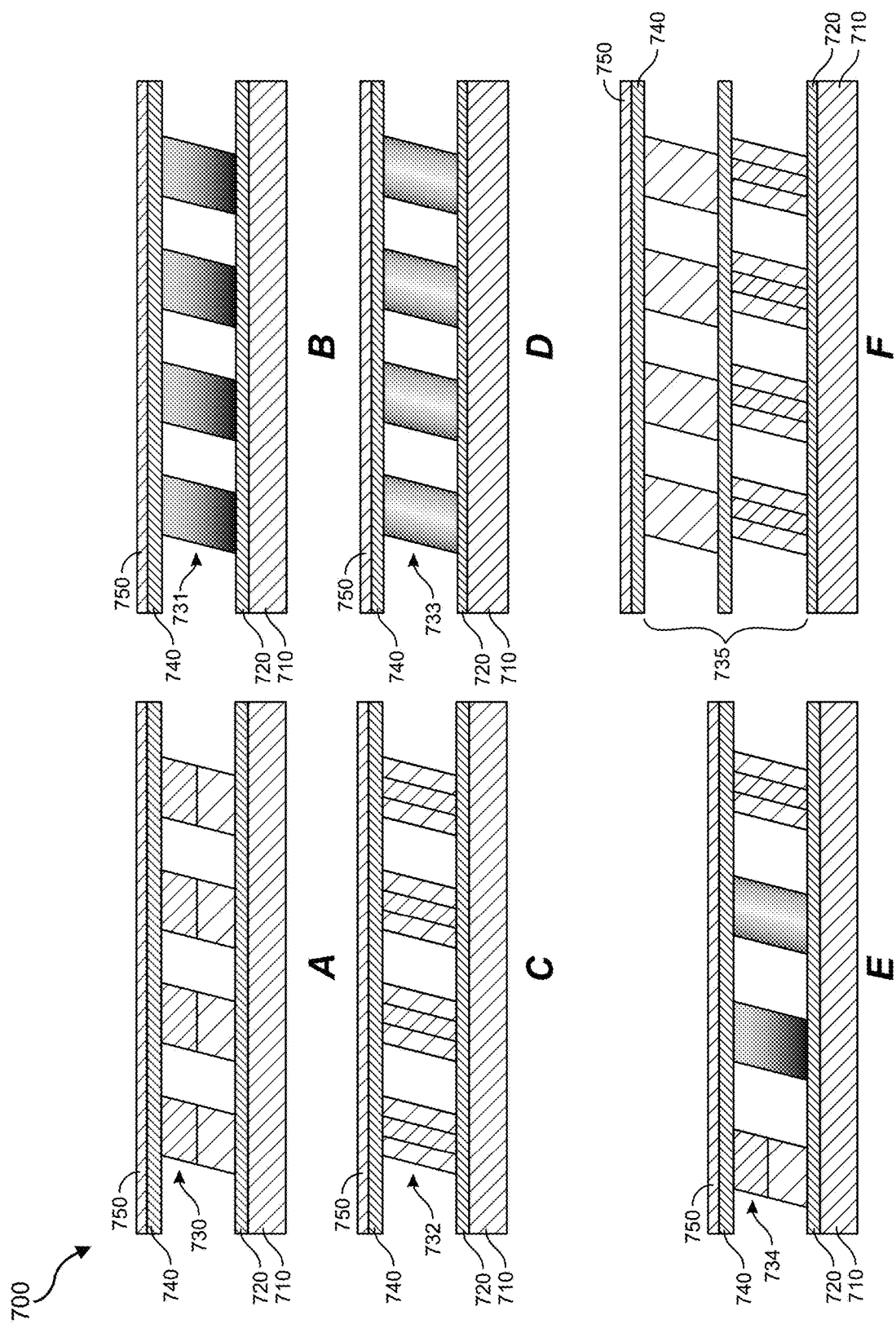
FIG. 7 is a schematic cross-sectional view of example structured actuators having shaped electroactive polymer layers characterized by varying material properties according to certain embodiments.

Referring to FIG. 6, shown is an additional method and structure for locally increasing the spacing between opposing electrodes in a structured actuator. In the embodiment of FIG. 6, method 600 may include forming a primary electrode 620 over a surface of a bottom substrate 610, forming a secondary electrode 640 over a surface of a top substrate 650, and forming a shaped electroactive polymer layer 630 between the bottom and top substrates, i.e., abutting the respective primary and secondary electrodes. As illustrated, the secondary electrode 640 may be patterned to form mesas 640a that contact the individual ribs or pillars 635, thereby increasing the gap between the primary electrode 620 and the secondary electrode 640 in regions between the ribs or pillars 635.

According to some embodiments, the ribs or pillars within a given electroactive polymer layer may be uniform, e.g., compositionally uniform, or a property of the electroactive polymer layer may vary as a function of position. For instance, referring to FIG. 7, example structured actuators 700 may include a bottom substrate 710, a primary electrode 720 disposed over a surface of the bottom substrate 710, an opposing top substrate 750 having a secondary electrode 740 disposed over a surface of the top substrate 750, and one or more layers of a shaped electroactive polymer 730, 731, 732, 733, 734, 735 dispose between the substrates, i.e., abutting respective primary and secondary electrodes.

By way of example, a property, e.g., composition, of the pillars or ribs may vary vertically (e.g., as in shaped electroactive polymer layer 730 and shaped electroactive polymer layer 731, as illustrated schematically in FIGS. 7A and 7B, respectively) or horizontally (e.g., as in shaped electroactive polymer layer 732 and shaped electroactive polymer layer 733, as illustrated schematically in FIGS. 7C and 7D, respectively). Moreover, the property gradient, e.g., composition gradient, may be discrete (e.g., as in shaped electroactive polymer layer 730 of FIG. 7A and shaped electroactive polymer layer 732 of FIG. 7C) or continuous (e.g., as in shaped electroactive polymer layer 731 of FIG. 7B and shaped electroactive polymer layer 733 of FIG. 7D). According to some embodiments, the property may vary within a given layer amongst different pillars/ribs (e.g., as in shaped electroactive polymer layer 734, shown in FIG. 7E) or between two or more layers of a multilayer structured actuator (as in shaped electroactive polymer layers 735, shown in FIG. 7F).

Figure 8:
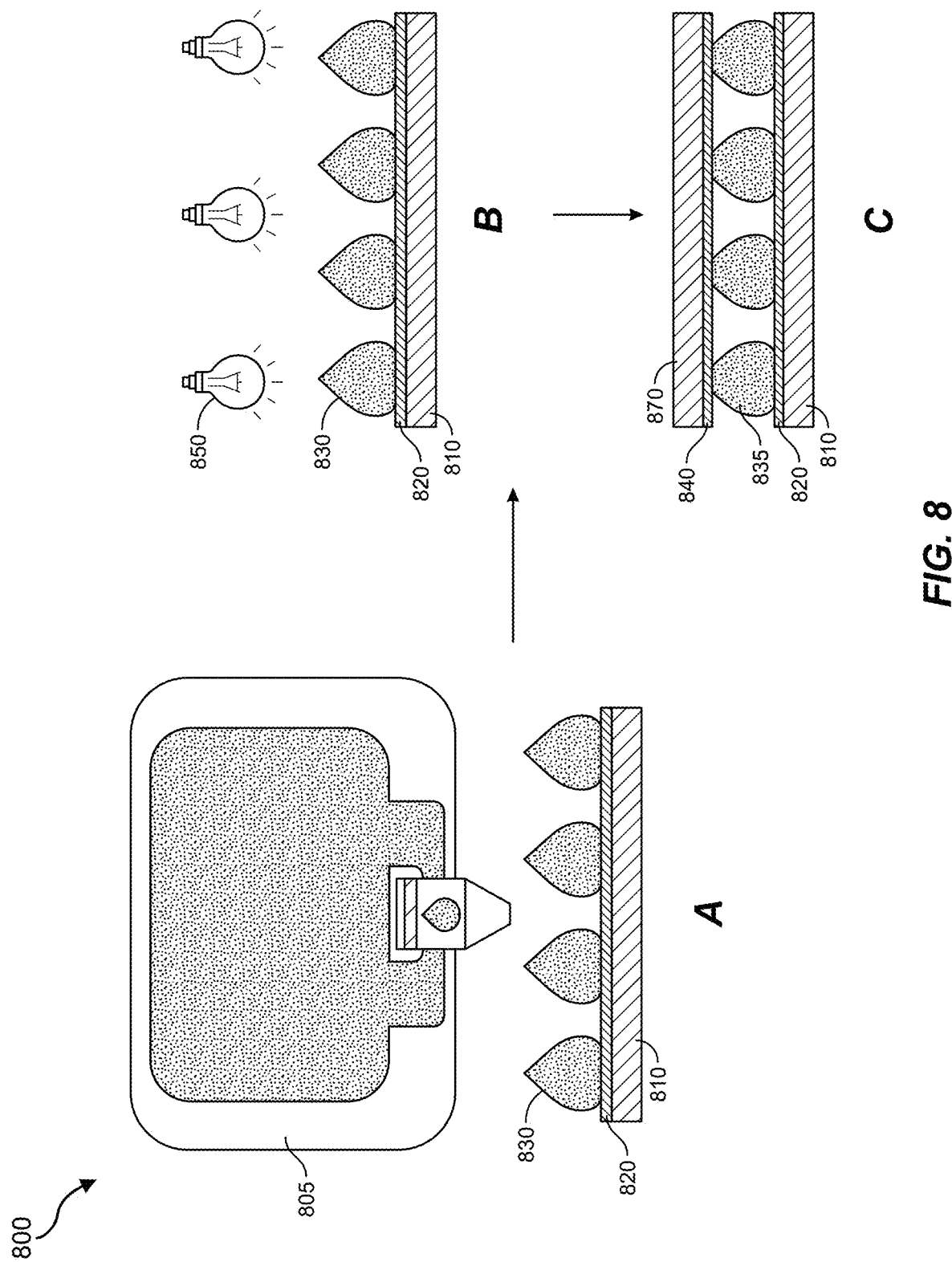
FIG. 8 illustrates a manufacturing process for forming a shaped electroactive polymer layer having a rib or pillar design according to some embodiments.
Figure 9:
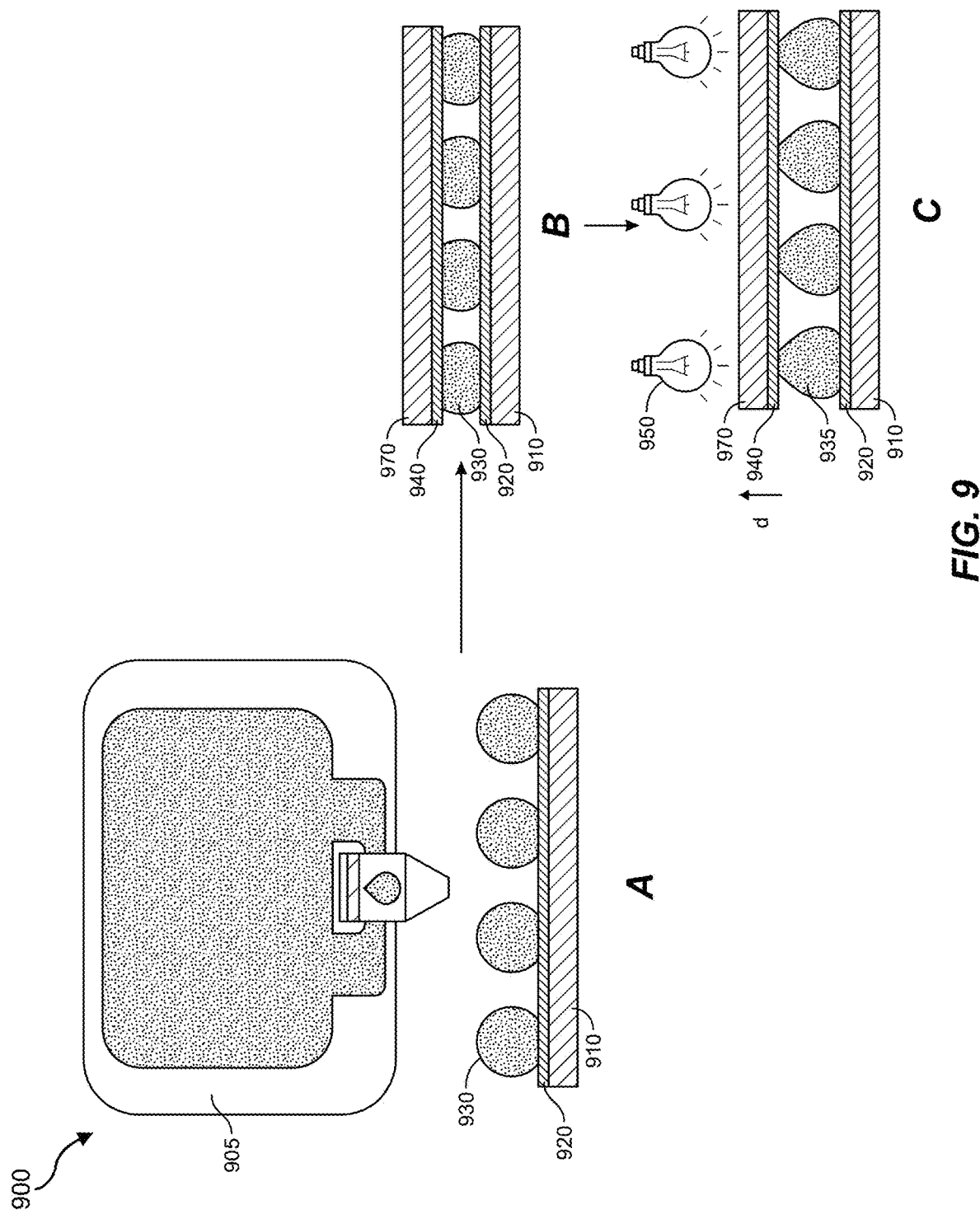
FIG. 9 illustrates a manufacturing process for forming a shaped electroactive polymer layer having a rib or pillar design according to further embodiments.

Referring to FIGS. 8 and 9, illustrated are example methods for forming a structured actuator including a shaped electroactive polymer layer, e.g., an electroactive polymer layer having a plurality of pillars and/or ribs. Referring to FIG. 8A, method 800 may include dispensing a polymer precursor composition from the reservoir of an inkjet cartridge 805. The polymer precursor composition may be dispensed onto an electroded substrate 810, i.e., directly onto electrode 820. In certain embodiments, the inkjet cartridge 805 and the substrate 810 may be moved laterally and/or vertically with respect to each other during printing to provide an uncured shaped layer 830 on the electroded substrate 810. Referring to FIG. 8B, layer 830 may be exposed to actinic radiation 850, which may cause cross-linking and polymerization and the attendant formation of a cured, shaped electroactive polymer layer 835 as shown in FIG. 8C. A further electroded substrate 870, including electrode 840, may be contacted with the shaped electroactive polymer layer 835.

Turning to method 900 of FIG. 9, an uncured layer 930 may be formed over an electroded substrate 910, i.e., directly over electrode 920, by dispensing a polymer precursor composition using inkjet cartridge 905, as shown in FIG. 9A. Referring to FIG. 9B, prior to curing, a further electroded substrate 970 may be laid over and contacted with the uncured electroactive polymer layer 930. That is, electrode 940 may directly contact layer 930. Layer 930 may be exposed to actinic radiation 950, which may cause cross-linking and polymerization. Referring to FIG. 9C, a displacement (d) of the further electroded substrate 970 with respect to the electroded substrate 910 may, in conjunction with the surface tension between the electrode 940 and the layer 930, be used to form a shaped electroactive polymer layer 935 during the act of curing.

Figure 11:
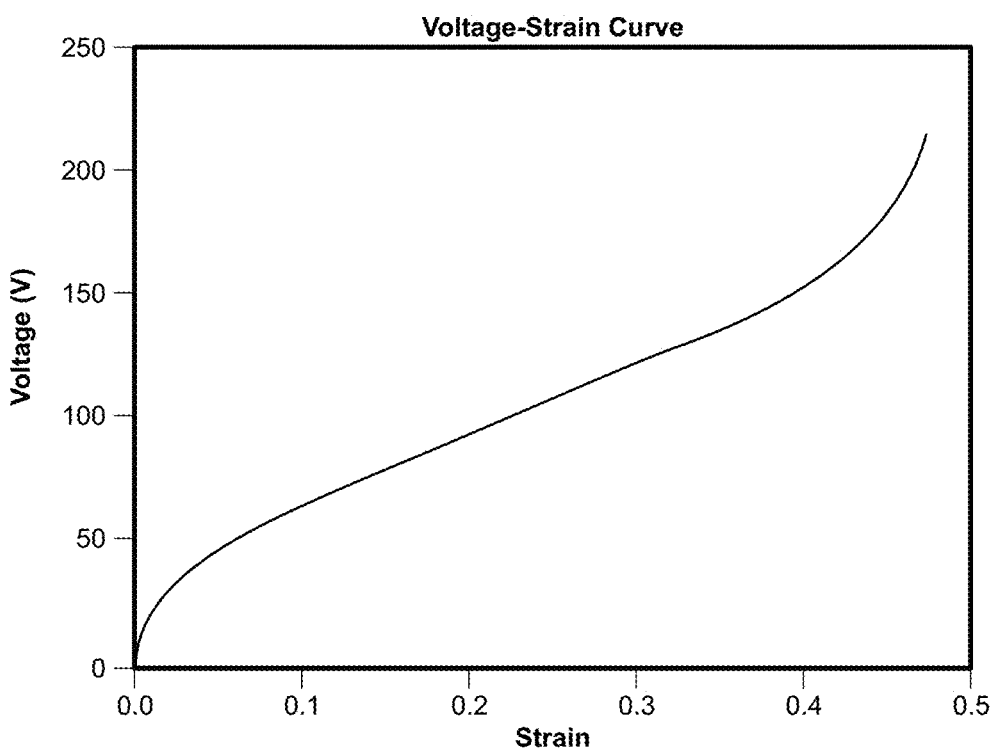
FIG. 11 is a plot of applied voltage versus strain for the modeled rib/pillar design of FIG. 10 according to some embodiments.

Referring now to FIG. 10, illustrated is a modeled rib/pillar design 1000 having a bulbous shape 1010 including substantially non-vertical and convex sidewalls. Shown also is the compression performance 1020 for rib/pillar design 1000. The rib/pillar design 1000 may advantageously exhibit a maximum von Mises stress of less than approximately 1 MPa up to a layer compression of approximately 48% and may be characterized by a substantially linear voltage versus deformation response 1100, as shown in FIG. 11.

Figure 12:
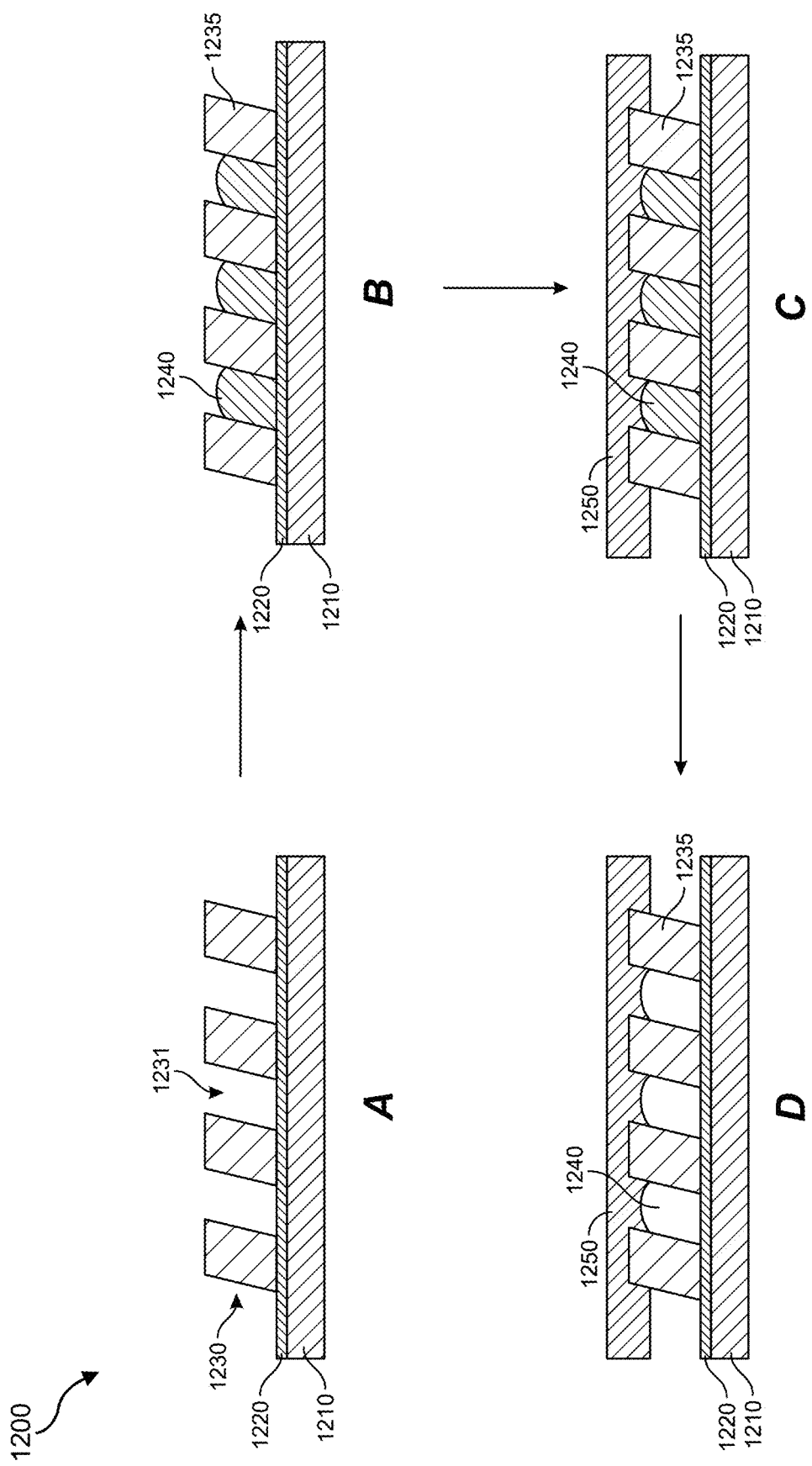
FIG. 12 illustrates a further example method for forming a structured actuator including a rib- or pillar-shaped electroactive polymer layer according to some embodiments.

According to certain embodiments, a further example method of forming a structured actuator is shown in FIG. 12. Referring to FIG. 12A, method 1200 may include forming a primary electrode 1220 over a surface of a bottom substrate 1210 and forming a shaped electroactive polymer layer 1230 over the primary electrode 1220. As shown in FIG. 12B, a sacrificial polymer layer 1240 may then be formed, e.g., by chemical vapor deposition, within gaps 1231 between neighboring ribs/pillars 1235. A top surface of the sacrificial polymer layer 1240 may be lower than a top surface of the electroactive polymer layer 1230. Subsequently, as shown in FIG. 12C, a secondary electrode 1250 may be formed over the ribs/pillars 1235 and over sacrificial polymer layer 1240, which forms a support surface for the secondary electrode 1250 between adjacent ribs/pillars 1235. Following deposition of the secondary electrode 1250, the sacrificial polymer layer 1240 may be removed using a selective etching technique, as shown in FIG. 12D.

Figure 13:
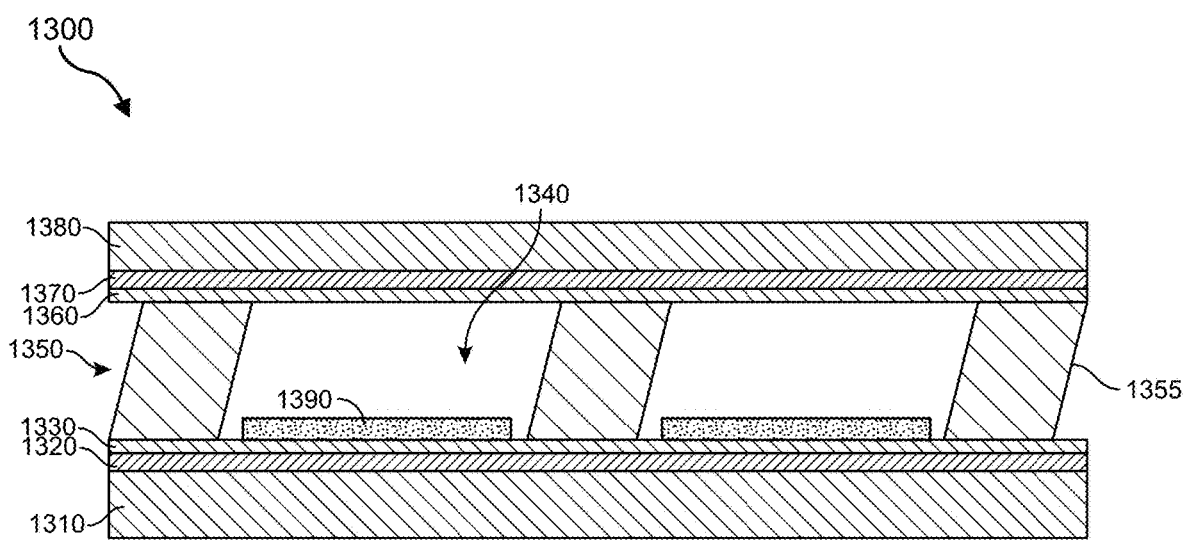
FIG. 13 is a schematic cross-sectional view of an example structured actuator having pillar or rib structures including a layer of high dielectric constant material therebetween according to certain embodiments.

Referring to FIG. 13, illustrated is a structured actuator design according to further embodiments. Structured actuator 1300 may include, from bottom to top, a bottom substrate 1310, a primary electrode 1320, a first polymer (e.g., adhesion) layer 1330, a shaped electroactive polymer layer 1350, a second polymer (e.g., adhesion) layer 1360, a secondary electrode 1370, and a top substrate 1380.

In the embodiments illustrated in FIGS. 13, 14, 16, and 17, a shaped electroactive polymer layer may be used (e.g., as a spring) to restrict the compression of the actuator to allow the space between adjacent pillars/ribs to create a compressive force. This may be accomplished by effectively increasing the distance between the primary and secondary electrodes.

Thus, referring still to FIG. 13, within gaps 1340 located between adjacent ribs or pillars 1355, a high dielectric constant layer 1390 may be formed over the bottom substrate 1310, e.g., directly over the first polymer layer 1330. The high dielectric constant layer 1390 may include barium titanate, for example, although other high dielectric constant materials may be used, and may be configured to increase the E-field across the remaining gap 1340. As used herein, a "high dielectric constant" material or layer may, in some examples, have a dielectric constant of at least approximately 10, e.g., 10, 20, 50, 100, 200, 500, 1000, 2000, 5000, 10000, or 15000, including ranges between any of the foregoing values.

Figure 14:
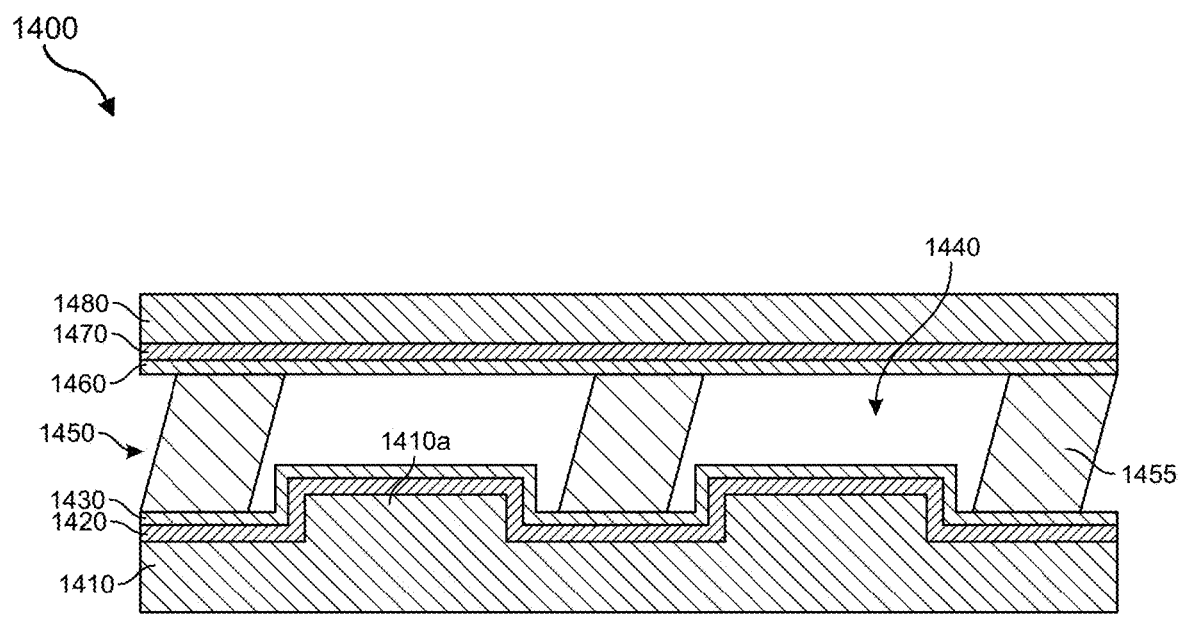
FIG. 14 is a schematic cross-sectional view of an example structured actuator having pillar or rib structures and a decreased inter-electrode gap according to certain embodiments.

According to further embodiments, the E-field across the inter-electrode gap between ribs or pillars may be increased by decreasing the distance between the primary electrode and the secondary electrode. As shown in FIG. 14, a structured actuator 1400 may include, from bottom to top, a bottom substrate 1410, a primary electrode 1420, a first polymer (e.g., adhesion) layer 1430, a shaped electroactive polymer layer 1450, a second polymer (e.g., adhesion) layer 1460, a secondary electrode 1470, and a top substrate 1480. Primary substrate 1410 may include a mesa 1410a that extends into the gap 1440 between neighboring ribs/pillars 1455. The primary electrode 1420 and the first polymer layer 1430 may be deposited as conformal layers over the mesa 1410a.

Figure 15:
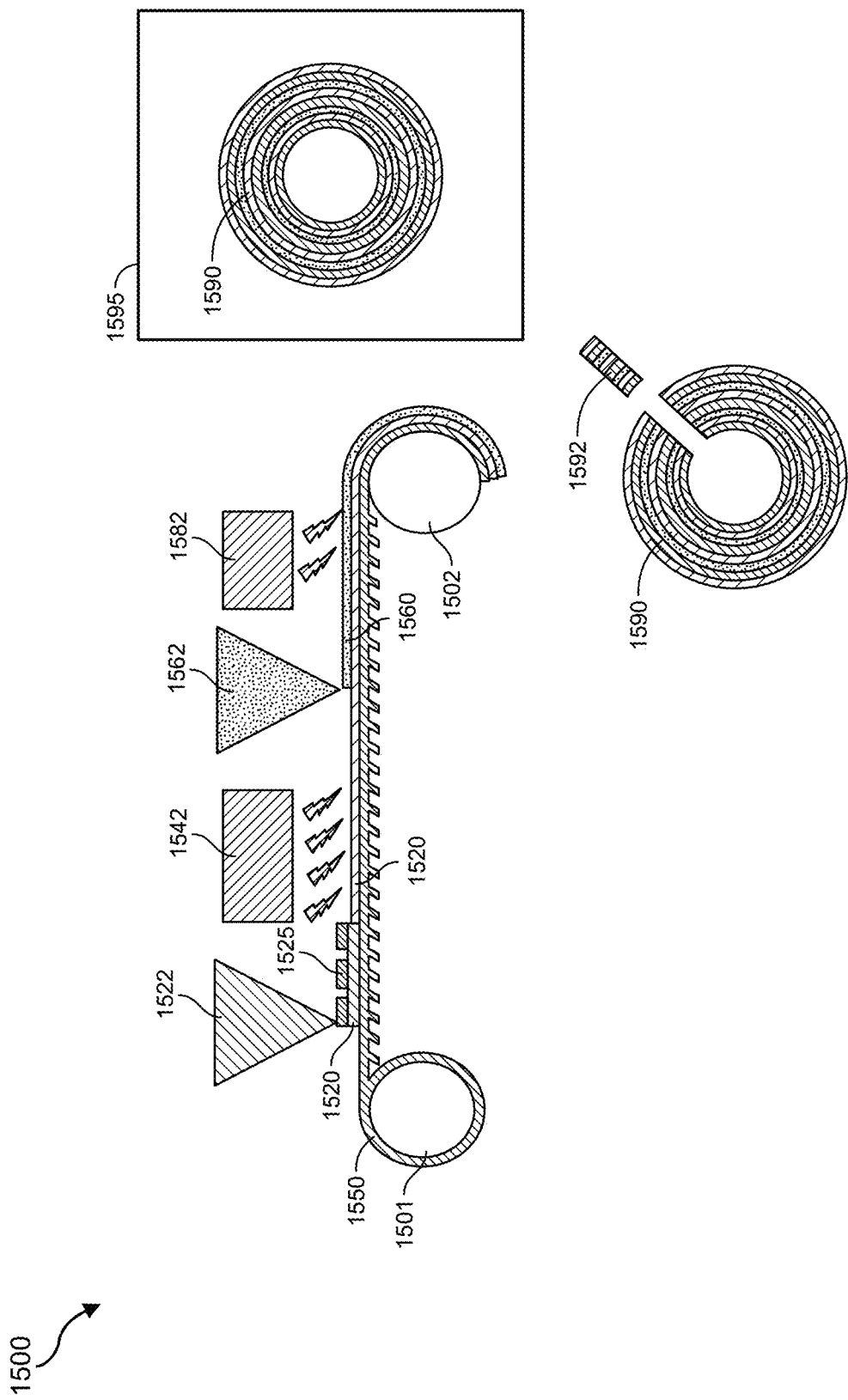
FIG. 15 depicts a roll-to-roll manufacturing process for forming a structured actuator according to various embodiments.

Referring to FIG. 15, shown is a generalized roll-to-roll manufacturing process 1500 that may be used to form a structured actuator. In the illustrated method, a microreplication process may be used to form a shaped electroactive polymer layer 1550, which may be fed from a first roll 1501. An electrode layer 1520 may be formed over a surface of the shaped electroactive polymer layer 1550 using a direct-write process such as ink jet printing or using a deposition and etch methodology in conjunction with dispensing element 1522 and a mask layer 1525 as shown. A curing element 1542 such as a UV lamp may be used to cure the electrode layer 1520 prior to the formation of an adhesive layer 1560 over the electrode layer 1520 using dispensing element 1562. A further curing element 1582 may be used to at least partially cure the adhesive layer 1560 prior to rolling the structured actuator stack onto second roll 1502. The entire rolled stack 1590 may be placed in an oven 1595 and thermally cured to fully cure the adhesive layer 1560. A dicing process may be used to harvest a structured actuator (i.e., actuator assembly) 1592 from roll 1590.

Figure 16:
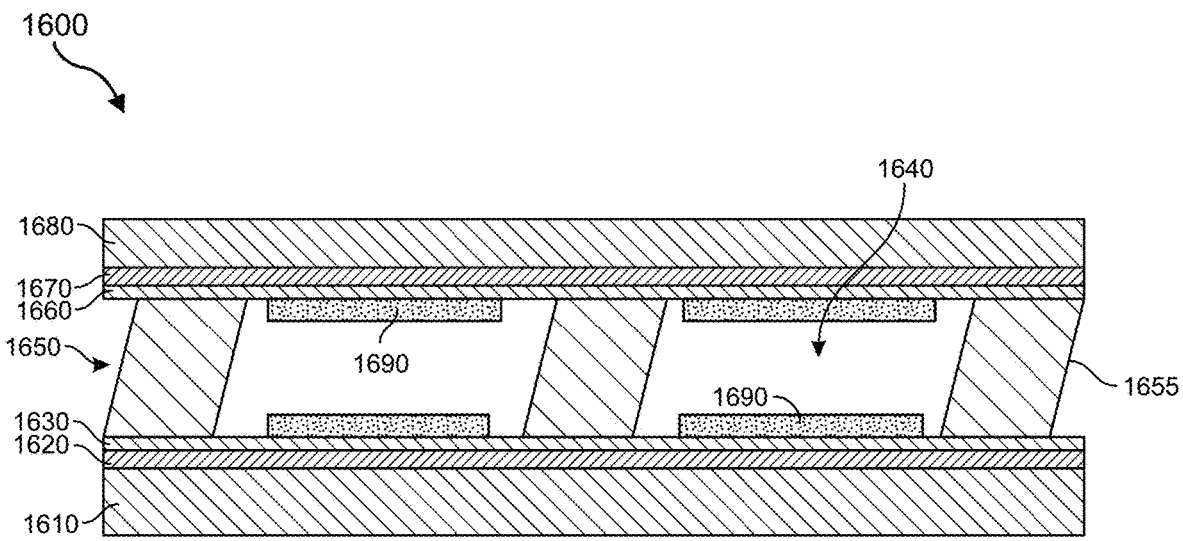
FIG. 16 is a schematic cross-sectional view of an example structured actuator having pillar or rib structures including layers of high dielectric constant material therebetween according to certain embodiments.

Referring to FIG. 16, illustrated is a structured actuator according to certain embodiments. Structured actuator 1600 may include, from bottom to top, a bottom substrate 1610, a primary electrode 1620, a first polymer (e.g., adhesion) layer 1630, a shaped electroactive polymer layer 1650, a second polymer (e.g., adhesion) layer 1660, a secondary electrode 1670, and a top substrate 1680. Within gaps 1640 located between adjacent ribs or pillars 1655, a pair of opposing high dielectric constant layers 1690 may be formed over the primary electrode 1620 and the secondary electrode 1670, i.e., directly over respective adhesion layers 1630, 1660. The high dielectric constant layers 1690 may include barium titanate, for example, although other high dielectric constant materials may be used, and may be configured to increase the E-field within the remaining gap 1640.

Figure 17:
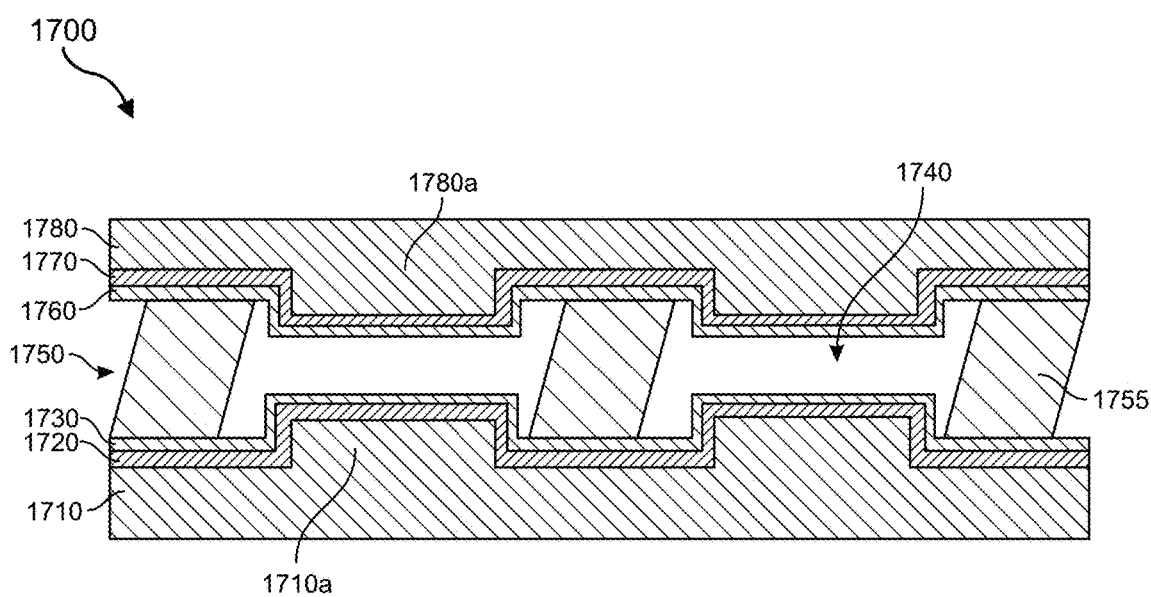
FIG. 17 is a schematic cross-sectional view of an example structured actuator having pillar or rib structures and a decreased inter-electrode gap according to certain embodiments.

According to further embodiments, the E-field across the gap between ribs or pillars of a structured actuator may be increased by decreasing the distance between the primary electrode and the secondary electrode. As shown in FIG. 17, a structured actuator 1700 may include, from bottom to top, a bottom substrate 1710, a primary electrode 1720, a first polymer (e.g., adhesion) layer 1730, a shaped electroactive polymer layer 1750, a second polymer (e.g., adhesion) layer 1760, a secondary electrode 1770, and a top substrate 1780. Primary substrate 1710 may include a mesa 1710a that extends into the gap 1740 between neighboring ribs/pillars 1755, and secondary substrate 1780 may include a mesa 1780a that extends into the gap 1740 opposite to mesa 1710a. As in the embodiment of FIG. 14, the primary electrode 1720 and the first polymer layer 1730 may be deposited as conformal layers over mesa 1710a, while the secondary electrode 1770 and the second polymer layer 1760 may be deposited as conformal layers over mesa 1780a.

According to various embodiments, a structured actuator may include a shaped electroactive polymer layer disposed between a pair of conductive electrodes. Example geometries for the electroactive polymer layer include asymmetrical, slanted, and bulging forms. These and other geometries may enable higher levels of compression, reduced stress, and an improved voltage/displacement curve during use. In particular, the structured forms may inhibit pull-in (i.e., uncontrolled collapse) in response to an applied field. The disclosed structured actuators may be incorporated into unimorph, bimorph, and multimorph architectures, and may be more energy efficient than conventional actuator geometries.

Figure 18:
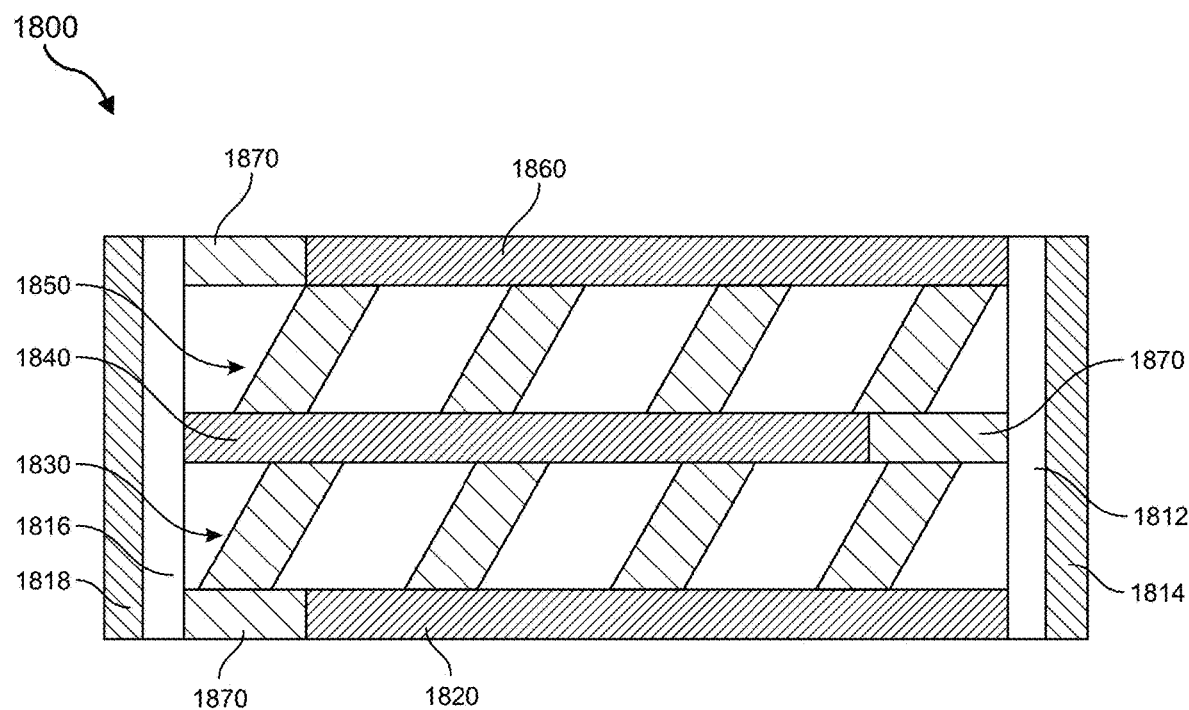
FIG. 18 is a diagram of an example structured actuator in accordance with some embodiments of this disclosure.

In some embodiments, a structured actuator may include at least two electroactive polymer layers, with each layer being driven by a respective pair of electrodes. Referring to FIG. 18, for example, a structured actuator 1800 may include a first polymer layer 1830 and a second polymer layer 1850, where the first polymer layer 1830 is disposed between a primary electrode 1820 and a secondary electrode 1840, and the second polymer layer 1850 is disposed between the secondary electrode 1840 and a tertiary electrode 1860.

In some embodiments, the primary electrode 1820 and the tertiary electrode 1860 may be electrically connected through a first contact (e.g., schoopage) layer 1812 to a first common electrode 1814. The secondary electrode 1840 may be connected via a second contact (e.g., schoopage) layer 1816 to a second common electrode 1818. The secondary electrode 1840 may be electrically isolated from the primary electrode 1820 and the tertiary electrode 1860 by insulator layers 1870. The insulator layers 1870 may include an electroactive polymer or a different dielectric material, such as, for example, an acrylate or silicone polymer. In some embodiments, the first contact layer 1812 and the second contact layer 1816 may include a metal (e.g., tin, aluminum, copper, gold, silver, and the like). In another aspect, the first contact layer 1812 and the second contact layer 1816 may include material that is similar, but not necessarily identical to, one or more of the electrodes (e.g., primary electrode 1820, secondary electrode 1840, tertiary electrode 1860, first common electrode 1814, or second common electrode 1818).

In some embodiments, the secondary electrode 1840 may overlap (e.g., overlap in a horizontal direction) at least a portion of the primary electrode 1820, and the tertiary electrode 1860 may overlap at least a portion of the secondary electrode 1840. The first polymer layer 1830 may include a first electroactive polymer material disposed between and abutting the primary electrode 1820 and the secondary electrode 1840. The second polymer layer 1850 may include a second electroactive polymer material disposed between and abutting the secondary electrode 1840 and the tertiary electrode 1860.

EXAMPLE EMBODIMENTS

Example 1

An actuator assembly includes a primary electrode, a secondary electrode overlapping at least a portion of the primary electrode, and an electroactive polymer layer disposed between the primary electrode and the secondary electrode, where the electroactive polymer layer may be characterized by a non-vertical sidewall with respect to a major surface of at least one of the electrodes.

Example 2

The actuator assembly of Example 1, where the electroactive polymer layer is at least approximately 90% dense.

Example 3

The actuator assembly of any of Examples 1 and 2, where the electroactive polymer layer includes at least one pair of opposing non-vertical sidewalls.

Example 4

The actuator assembly of any of Examples 1-3, where the electroactive polymer layer includes a plurality of non-vertical sidewalls.

Example 5

The actuator assembly of any of Examples 1-4, where the electroactive polymer layer includes a plurality of ribs or pillars.

Example 6

The actuator assembly of Example 5, where the ribs or pillars are non-axisymmetric.

Example 7

The actuator assembly of any of Examples 5 and 6, further including a layer of high dielectric constant material located over the primary electrode and between an adjacent pair of the ribs or pillars.

Example 8

The actuator assembly of any of Examples 5-7, where the primary electrode is disposed over a substrate, the substrate having an upwardly-extending mesa between an adjacent pair of the ribs or pillars.

Example 9

The actuator assembly of any of Examples 1-8, where the electroactive polymer layer includes a first width adjacent to the primary electrode, a second width adjacent to the secondary electrode, and an intermediate width between the primary width and the secondary width, the intermediate width being greater than the primary width and greater than the secondary width.

Example 10

The actuator assembly of any of Examples 1-9, where the non-vertical sidewall includes a non-planar region.

Example 11

The actuator assembly of any of Examples 1-10, where the non-vertical sidewall includes a concave region.

Example 12

The actuator assembly of any of Examples 1-11, where the non-vertical sidewall includes a convex region.

Example 13

The actuator assembly of any of Examples 1-12, further including an adhesive polymer layer disposed between the electroactive polymer layer and at least one of the primary electrode and the secondary electrode.

Example 14

An actuator assembly includes a structured electroactive polymer layer disposed between a primary electrode and a secondary electrode, the structured electroactive polymer layer including a non-axisymmetric shape with respect to an axis oriented substantially orthogonal to a major surface of the primary electrode.

Example 15

The actuator assembly of Example 14, where the structured electroactive polymer layer includes an undercut region.

Example 16

A method includes forming a shaped electroactive polymer layer over a primary electrode, the shaped electroactive polymer layer including a non-vertical sidewall with respect to a major surface of the primary electrode, and forming a secondary electrode over the shaped electroactive polymer layer.

Example 17

The method of Example 16, where forming the shaped electroactive polymer layer includes (a) depositing a polymer precursor composition over the primary electrode, the polymer precursor composition including a curable material and a solvent, and (b) curing the curable material while the polymer precursor composition is in contact with a microreplication tool.

Example 18

The method of Example 16, where forming the shaped electroactive polymer layer includes (a) depositing a layer of a polymer precursor composition over the primary electrode, the polymer precursor composition comprising a curable material and a solvent, (b) deforming the layer of the polymer precursor composition, and (c) curing the curable material.

Example 19

The method of any of Examples 16-18, where forming the shaped electroactive polymer layer includes ink jet printing a layer of a polymer precursor composition over the primary electrode.

Example 20

The method of any of Examples 16-19, further including forming a conformal adhesion layer over the shaped electroactive polymer layer prior to forming the secondary electrode.

Embodiments of the present disclosure may include or be implemented in conjunction with various types of artificial-reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs), an example of which is augmented-reality system 1900 in FIG. 19. Other artificial-reality systems may include an NED that also provides visibility into the real world (e.g., augmented-reality system 2000 in FIG. 20) or that visually immerses a user in an artificial reality (e.g., virtual-reality system 2100 in FIG. 21). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 19:
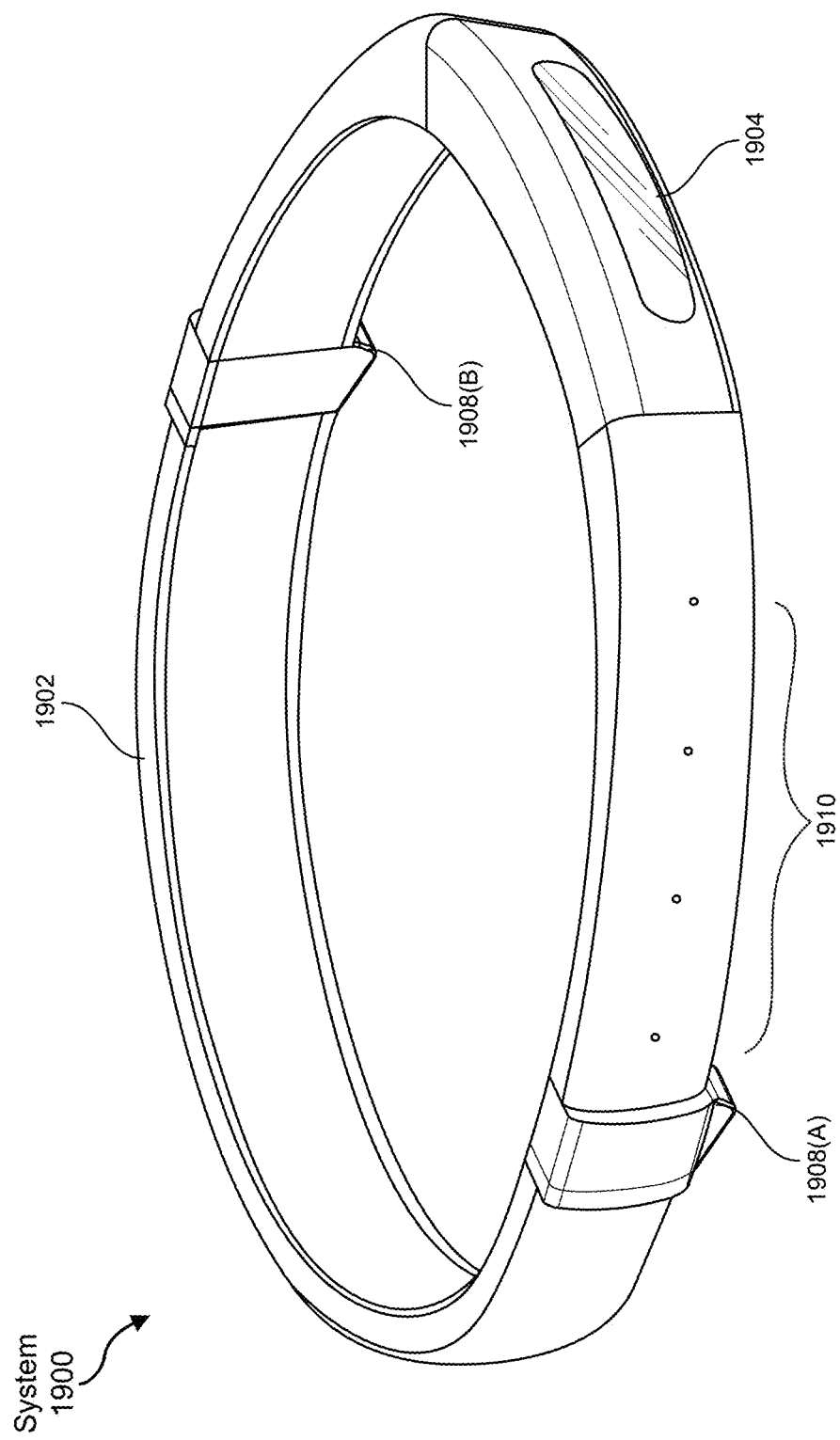
FIG. 19 is an illustration of an exemplary artificial-reality headband that may be used in connection with embodiments of this disclosure.

Turning to FIG. 19, augmented-reality system 1900 generally represents a wearable device dimensioned to fit about a body part (e.g., a head) of a user. As shown in FIG. 19, system 1900 may include a frame 1902 and a camera assembly 1904 that is coupled to frame 1902 and configured to gather information about a local environment by observing the local environment. Augmented-reality system 1900 may also include one or more audio devices, such as output audio transducers 1908(A) and 1908(B) and input audio transducers 1910. Output audio transducers 1908(A) and 1908(B) may provide audio feedback and/or content to a user, and input audio transducers 1910 may capture audio in a user's environment.

As shown, augmented-reality system 1900 may not necessarily include an NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 1900 may not include an NED, augmented-reality system 1900 may include other types of screens or visual feedback devices (e.g., a display screen integrated into a side of frame 1902).

Figure 20:
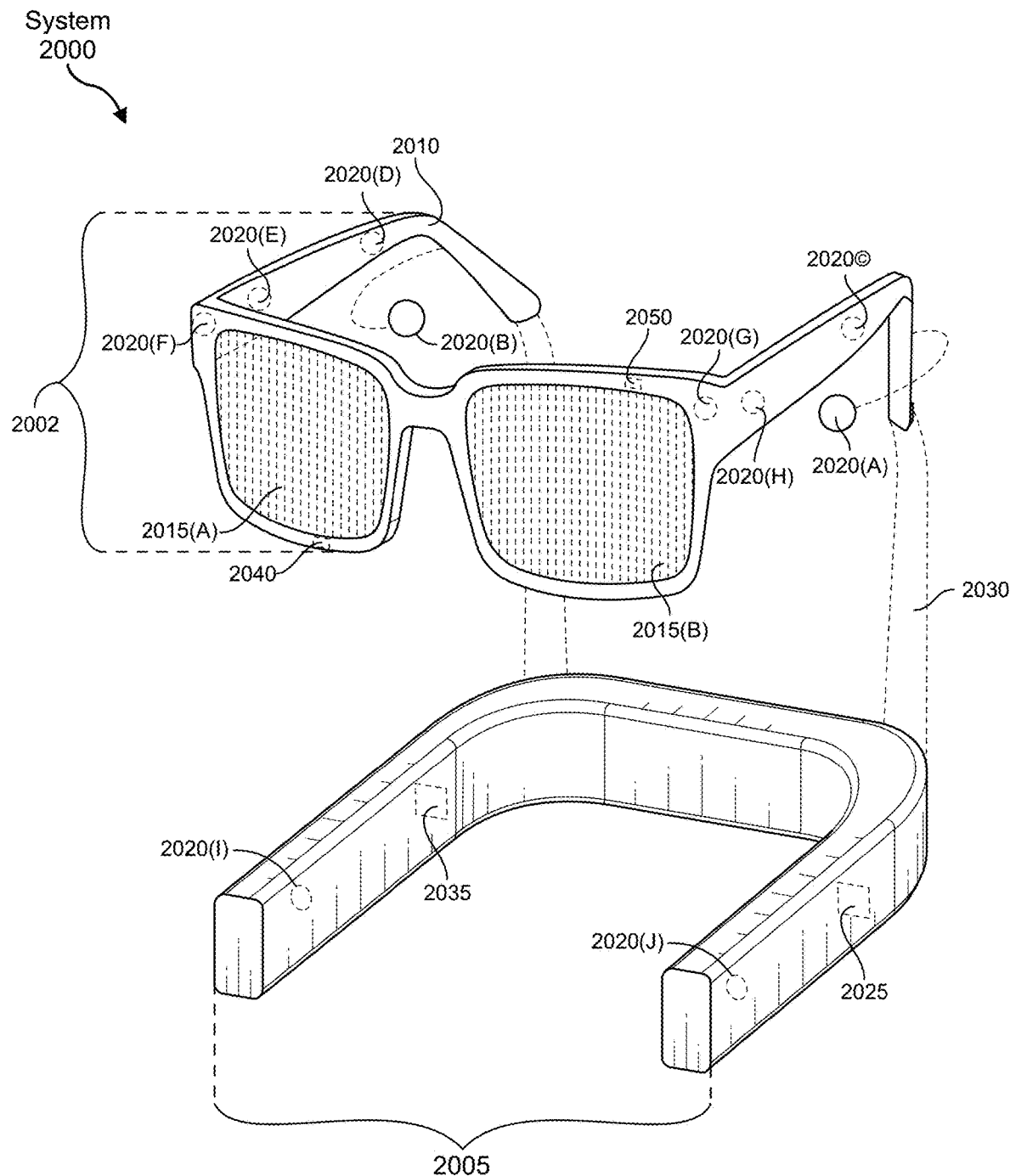
FIG. 20 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 20, augmented-reality system 2000 may include an eyewear device 2002 with a frame 2010 configured to hold a left display device 2015(A) and a right display device 2015(B) in front of a user's eyes. Display devices 2015(A) and 2015(B) may act together or independently to present an image or series of images to a user. While augmented-reality system 2000 includes two displays, embodiments of this disclosure may be implemented in augmented-reality systems with a single NED or more than two NEDs.

In some embodiments, augmented-reality system 2000 may include one or more sensors, such as sensor 2040. Sensor 2040 may generate measurement signals in response to motion of augmented-reality system 2000 and may be located on substantially any portion of frame 2010. Sensor 2040 may represent a position sensor, an inertial measurement unit (IMU), a depth camera assembly, or any combination thereof. In some embodiments, augmented-reality system 2000 may or may not include sensor 2040 or may include more than one sensor. In embodiments in which sensor 2040 includes an IMU, the IMU may generate calibration data based on measurement signals from sensor 2040. Examples of sensor 2040 may include, without limitation, accelerometers, gyroscopes, magnetometers, other suitable types of sensors that detect motion, sensors used for error correction of the IMU, or some combination thereof. Augmented-reality system 2000 may also include a microphone array with a plurality of acoustic transducers 2020 (A)-2020(J), referred to collectively as acoustic transducers 2020. Acoustic transducers 2020 may be transducers that detect air pressure variations induced by sound waves. Each acoustic transducer 2020 may be configured to detect sound and convert the detected sound into an electronic format (e.g., an analog or digital format). The microphone array in FIG. 2 may include, for example, ten acoustic transducers: 2020(A) and 2020(B), which may be designed to be placed inside a corresponding ear of the user, acoustic transducers 2020(C), 2020(D), 2020(E), 2020(F), 2020(G), and 2020 (H), which may be positioned at various locations on frame 2010, and/or acoustic transducers 2020(1) and 2020(J), which may be positioned on a corresponding neckband 2005.

In some embodiments, one or more of acoustic transducers 2020(A)-(F) may be used as output transducers (e.g., speakers). For example, acoustic transducers 2020(A) and/or 2020(B) may be earbuds or any other suitable type of headphone or speaker.

The configuration of acoustic transducers 2020 of the microphone array may vary. While augmented-reality system 2000 is shown in FIG. 20 as having ten acoustic transducers 2020, the number of acoustic transducers 2020 may be greater or less than ten. In some embodiments, using higher numbers of acoustic transducers 2020 may increase the amount of audio information collected and/or the sensitivity and accuracy of the audio information. In contrast, using a lower number of acoustic transducers 2020 may decrease the computing power required by an associated controller 2050 to process the collected audio information. In addition, the position of each acoustic transducer 2020 of the microphone array may vary. For example, the position of an acoustic transducer 2020 may include a defined position on the user, a defined coordinate on frame 2010, an orientation associated with each acoustic transducer 2020, or some combination thereof.

Acoustic transducers 2020(A) and 2020(B) may be positioned on different parts of the user's ear, such as behind the pinna or within the auricle or fossa. Or, there may be additional acoustic transducers 2020 on or surrounding the ear in addition to acoustic transducers 2020 inside the ear canal. Having an acoustic transducer 2020 positioned next to an ear canal of a user may enable the microphone array to collect information on how sounds arrive at the ear canal. By positioning at least two of acoustic transducers 2020 on either side of a user's head (e.g., as binaural microphones), augmented-reality device 2000 may simulate binaural hearing and capture a 3D stereo sound field around about a user's head. In some embodiments, acoustic transducers 2020(A) and 2020(B) may be connected to augmented-reality system 2000 via a wired connection 2030, and in other embodiments, acoustic transducers 2020(A) and 2020(B) may be connected to augmented-reality system 2000 via a wireless connection (e.g., a Bluetooth connection). In still other embodiments, acoustic transducers 2020(A) and 2020(B) may not be used at all in conjunction with augmented-reality system 2000.

Acoustic transducers 2020 on frame 2010 may be positioned along the length of the temples, across the bridge, above or below display devices 2015(A) and 2015(B), or some combination thereof. Acoustic transducers 2020 may be oriented such that the microphone array is able to detect sounds in a wide range of directions surrounding the user wearing the augmented-reality system 2000. In some embodiments, an optimization process may be performed during manufacturing of augmented-reality system 2000 to determine relative positioning of each acoustic transducer 2020 in the microphone array.

In some examples, augmented-reality system 2000 may include or be connected to an external device (e.g., a paired device), such as neckband 2005. Neckband 2005 generally represents any type or form of paired device. Thus, the following discussion of neckband 2005 may also apply to various other paired devices, such as charging cases, smart watches, smart phones, wrist bands, other wearable devices, hand-held controllers, tablet computers, laptop computers and other external compute devices, etc.

As shown, neckband 2005 may be coupled to eyewear device 2002 via one or more connectors. The connectors may be wired or wireless and may include electrical and/or non-electrical (e.g., structural) components. In some cases, eyewear device 2002 and neckband 2005 may operate independently without any wired or wireless connection between them. While FIG. 20 illustrates the components of eyewear device 2002 and neckband 2005 in example locations on eyewear device 2002 and neckband 2005, the components may be located elsewhere and/or distributed differently on eyewear device 2002 and/or neckband 2005. In some embodiments, the components of eyewear device 2002 and neckband 2005 may be located on one or more additional peripheral devices paired with eyewear device 2002, neckband 2005, or some combination thereof.

Pairing external devices, such as neckband 2005, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 2000 may be provided by a paired device or shared between a paired device and an eyewear device, thus reducing the weight, heat profile, and form factor of the eyewear device overall while still retaining desired functionality. For example, neckband 2005 may allow components that would otherwise be included on an eyewear device to be included in neckband 2005 since users may tolerate a heavier weight load on their shoulders than they would tolerate on their heads. Neckband 2005 may also have a larger surface area over which to diffuse and disperse heat to the ambient environment. Thus, neckband 2005 may allow for greater battery and computation capacity than might otherwise have been possible on a stand-alone eyewear device. Since weight carried in neckband 2005 may be less invasive to a user than weight carried in eyewear device 2002, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 2005 may be communicatively coupled with eyewear device 2002 and/or to other devices. These other devices may provide certain functions (e.g., tracking, localizing, depth mapping, processing, storage, etc.) to augmented-reality system 2000. In the embodiment of FIG. 20, neckband 2005 may include two acoustic transducers (e.g., 2020(1) and 2020(J)) that are part of the microphone array (or potentially form their own microphone subarray). Neckband 2005 may also include a controller 2025 and a power source 2035.

Acoustic transducers 2020(1) and 2020(J) of neckband 2005 may be configured to detect sound and convert the detected sound into an electronic format (analog or digital). In the embodiment of FIG. 20, acoustic transducers 2020(1) and 2020(J) may be positioned on neckband 2005, thereby increasing the distance between the neckband acoustic transducers 2020(1) and 2020(J) and other acoustic transducers 2020 positioned on eyewear device 2002. In some cases, increasing the distance between acoustic transducers 2020 of the microphone array may improve the accuracy of beamforming performed via the microphone array. For example, if a sound is detected by acoustic transducers 2020(C) and 2020(D) and the distance between acoustic transducers 2020(C) and 2020(D) is greater than, e.g., the distance between acoustic transducers 2020(D) and 2020(E), the determined source location of the detected sound may be more accurate than if the sound had been detected by acoustic transducers 2020(D) and 2020(E).

Controller 2025 of neckband 2005 may process information generated by the sensors on neckband 2005 and/or augmented-reality system 2000. For example, controller 2025 may process information from the microphone array that describes sounds detected by the microphone array. For each detected sound, controller 2025 may perform a direction-of-arrival (DOA) estimation to estimate a direction from which the detected sound arrived at the microphone array. As the microphone array detects sounds, controller 2025 may populate an audio data set with the information. In embodiments in which augmented-reality system 2000 includes an inertial measurement unit, controller 2025 may compute all inertial and spatial calculations from the IMU located on eyewear device 2002. A connector may convey information between augmented-reality system 2000 and neckband 2005 and between augmented-reality system 2000 and controller 2025. The information may be in the form of optical data, electrical data, wireless data, or any other transmittable data form. Moving the processing of information generated by augmented-reality system 2000 to neckband 2005 may reduce weight and heat in eyewear device 2002, making it more comfortable to the user.

Power source 2035 in neckband 2005 may provide power to eyewear device 2002 and/or to neckband 2005. Power source 2035 may include, without limitation, lithium ion batteries, lithium-polymer batteries, primary lithium batteries, alkaline batteries, or any other form of power storage. In some cases, power source 2035 may be a wired power source. Including power source 2035 on neckband 2005 instead of on eyewear device 2002 may help better distribute the weight and heat generated by power source 2035.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 2100 in FIG. 21, that mostly or completely covers a user's field of view. Virtual-reality system 2100 may include a front rigid body 2102 and a band 2104 shaped to fit around a user's head. Virtual-reality system 2100 may also include output audio transducers 2106(A) and 2106(B). Furthermore, while not shown in FIG. 21, front rigid body 2102 may include one or more electronic elements, including one or more electronic displays, one or more inertial measurement units (IMUS), one or more tracking emitters or detectors, and/or any other suitable device or system for creating an artificial reality experience.

Artificial-reality systems may include a variety of types of visual feedback mechanisms. For example, display devices in augmented-reality system 2000 and/or virtual-reality system 2100 may include one or more liquid crystal displays (LCDs), light emitting diode (LED) displays, organic LED (OLED) displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial-reality systems may include one or more projection systems. For example, display devices in augmented-reality system 2000 and/or virtual-reality system 2100 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. Artificial-reality systems may also be configured with any other suitable type or form of image projection system.

Artificial-reality systems may also include various types of computer vision components and subsystems. For example, augmented-reality system 1900, augmented-reality system 2000, and/or virtual-reality system 2100 may include one or more optical sensors, such as two-dimensional (2D) or 3D cameras, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIGS. 19 and 21, output audio transducers 1908(A), 1908(B), 2106(A), and 2106(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 1910 may include condenser microphones, dynamic microphones, ribbon microphones, and/or any other type or form of input transducer. In some embodiments, a single transducer may be used for both audio input and audio output.

Figure 21:
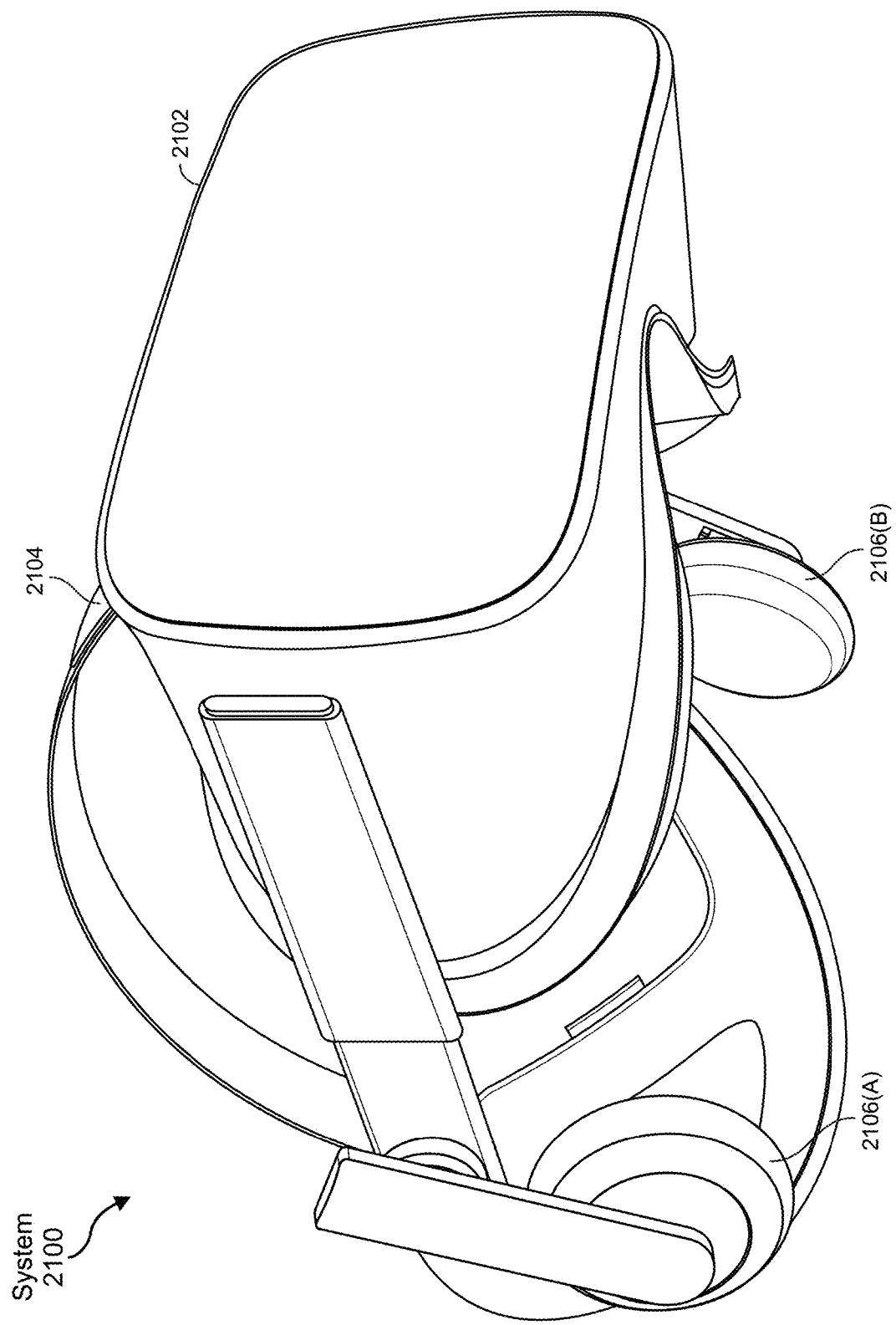
FIG. 21 is an illustration of an exemplary virtual-reality headset that may be used in connection with embodiments of this disclosure.

While not shown in FIGS. 19-21, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial-reality experience in one or more of these contexts and environments and/or in other contexts and environments.

As noted, artificial-reality systems 1900, 2000, and 2100 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 22:
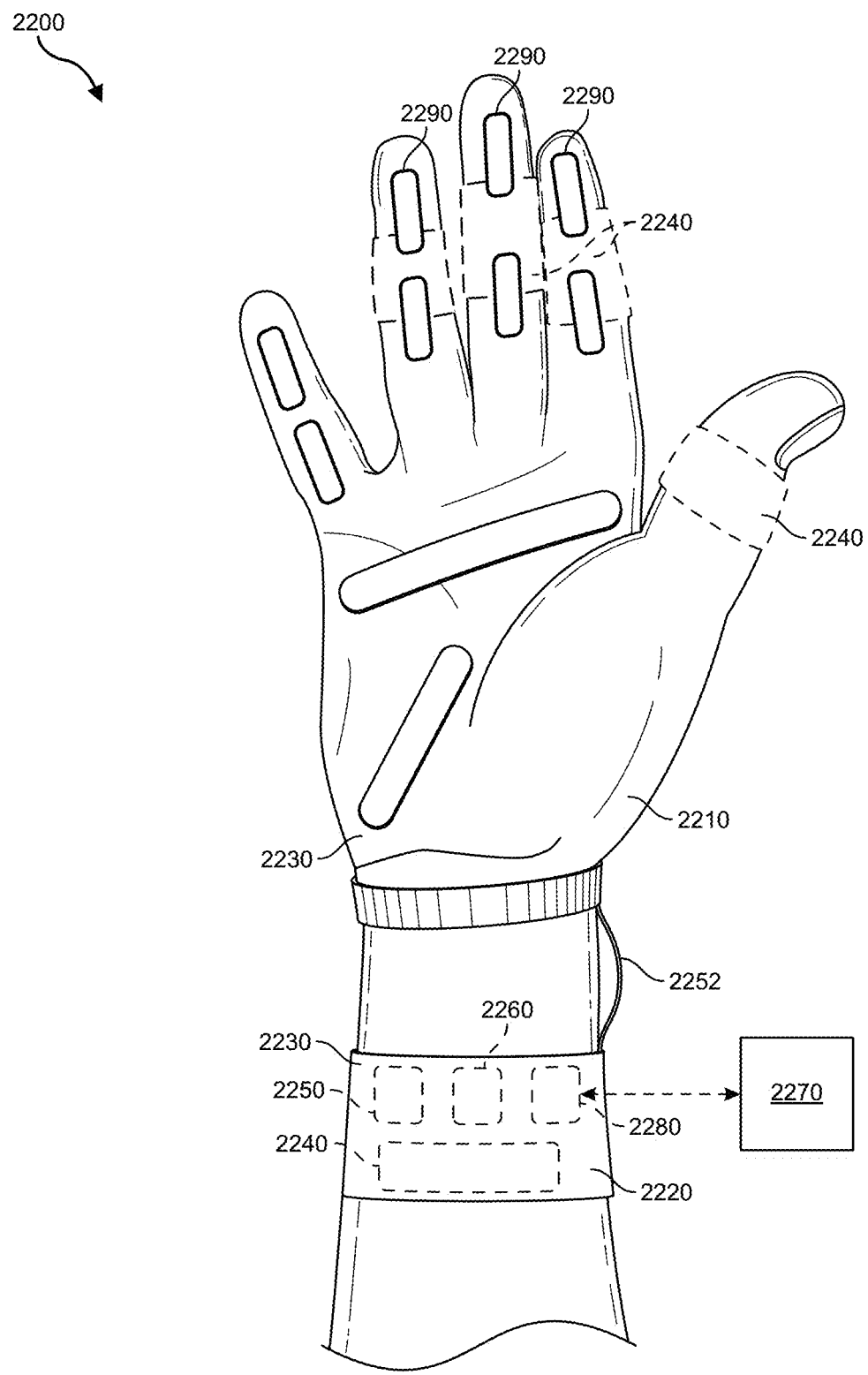
FIG. 22 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 22 illustrates a vibrotactile system 2200 in the form of a wearable glove (haptic device 2210) and wristband (haptic device 2220). Haptic device 2210 and haptic device 2220 are shown as examples of wearable devices that include a flexible, wearable textile material 2230 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, nonwoven fabric, leather, cloth, a flexible polymer material, composite materials, etc.

One or more vibrotactile devices 2240 may be positioned at least partially within one or more corresponding pockets formed in textile material 2230 of vibrotactile system 2200. Vibrotactile devices 2240 may be positioned in locations to provide a vibrating sensation (e.g., haptic feedback) to a user of vibrotactile system 2200. For example, vibrotactile devices 2240 may be positioned to be against the user's finger(s), thumb, or wrist, as shown in FIG. 22. Vibrotactile devices 2240 may, in some examples, be sufficiently flexible to conform to or bend with the user's corresponding body part(s).

A power source 2250 (e.g., a battery) for applying a voltage to the vibrotactile devices 2240 for activation thereof may be electrically coupled to vibrotactile devices 2240, such as via conductive wiring 2252. In some examples, each of vibrotactile devices 2240 may be independently electrically coupled to power source 2250 for individual activation. In some embodiments, a processor 2260 may be operatively coupled to power source 2250 and configured (e.g., programmed) to control activation of vibrotactile devices 2240.

Vibrotactile system 2200 may be implemented in a variety of ways. In some examples, vibrotactile system 2200 may be a standalone system with integral subsystems and components for operation independent of other devices and systems. As another example, vibrotactile system 2200 may be configured for interaction with another device or system 2270. For example, vibrotactile system 2200 may, in some examples, include a communications interface 2280 for receiving and/or sending signals to the other device or system 2270. The other device or system 2270 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 2280 may enable communications between vibrotactile system 2200 and the other device or system 2270 via a wireless (e.g., Wi-Fi, Bluetooth, cellular, radio, etc.) link or a wired link. If present, communications interface 2280 may be in communication with processor 2260, such as to provide a signal to processor 2260 to activate or deactivate one or more of the vibrotactile devices 2240.

Vibrotactile system 2200 may optionally include other subsystems and components, such as touch-sensitive pads 2290, pressure sensors, motion sensors, position sensors, lighting elements, and/or user interface elements (e.g., an on/off button, a vibration control element, etc.). During use, vibrotactile devices 2240 may be configured to be activated for a variety of different reasons, such as in response to the user's interaction with user interface elements, a signal from the motion or position sensors, a signal from the touch-sensitive pads 2290, a signal from the pressure sensors, a signal from the other device or system 2270, etc.

Although power source 2250, processor 2260, and communications interface 2280 are illustrated in FIG. 22 as being positioned in haptic device 2220, the present disclosure is not so limited. For example, one or more of power source 2250, processor 2260, or communications interface 2280 may be positioned within haptic device 2210 or within another wearable textile.

Figure 23:
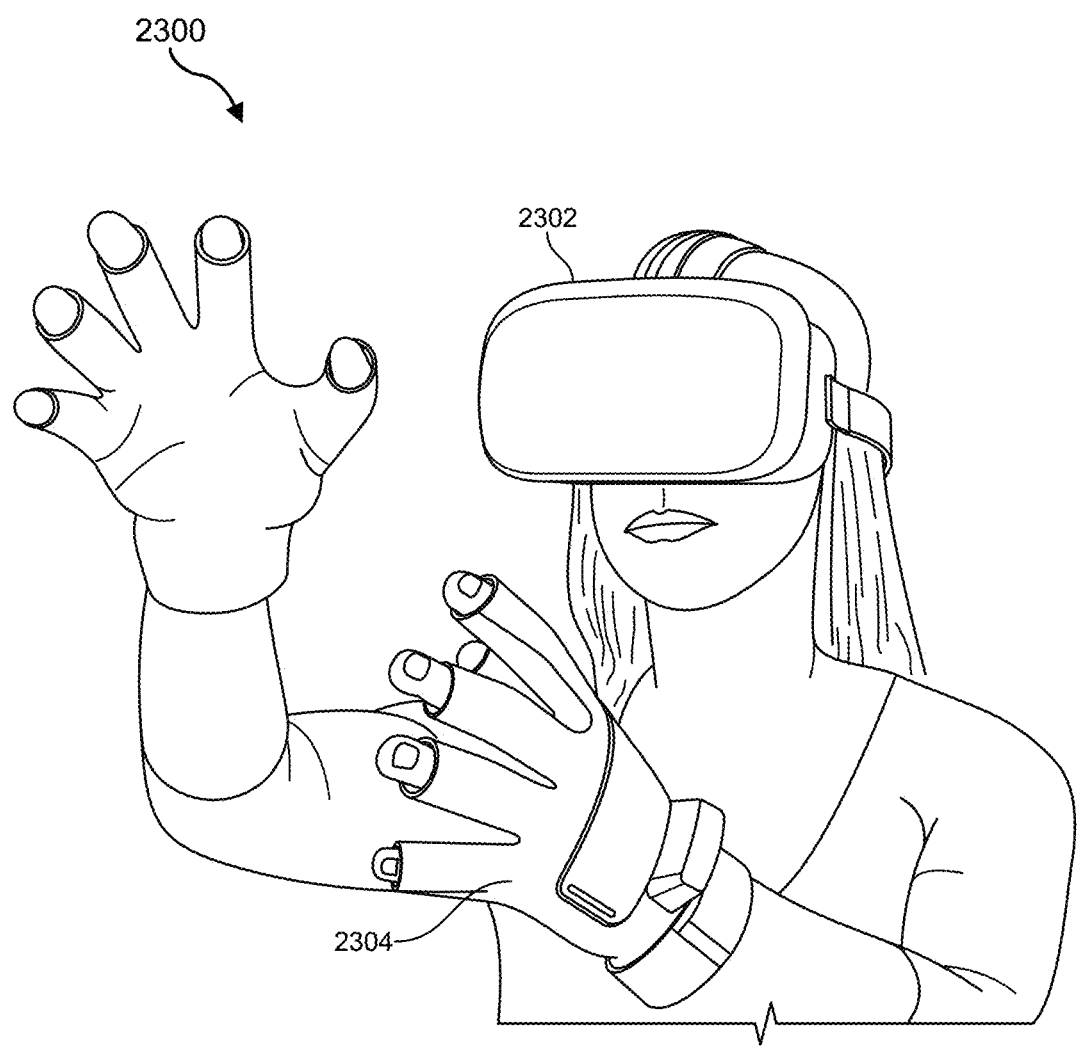
FIG. 23 is an illustration of an exemplary virtual-reality environment according to embodiments of this disclosure.

Haptic wearables, such as those shown in and described in connection with FIG. 22, may be implemented in a variety of types of artificial-reality systems and environments. FIG. 23 shows an example artificial-reality environment 2300 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Head-mounted display 2302 generally represents any type or form of virtual-reality system, such as virtual-reality system 2100 in FIG. 21. Haptic device 2304 generally represents any type or form of wearable device, worn by a use of an artificial-reality system, that provides haptic feedback to the user to give the user the perception that he or she is physically engaging with a virtual object. In some embodiments, haptic device 2304 may provide haptic feedback by applying vibration, motion, and/or force to the user. For example, haptic device 2304 may limit or augment a user's movement. To give a specific example, haptic device 2304 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 2304 to send action requests to a console. Examples of action requests include, without limitation, requests to start an application and/or end the application and/or requests to perform a particular action within the application.

Figure 24:
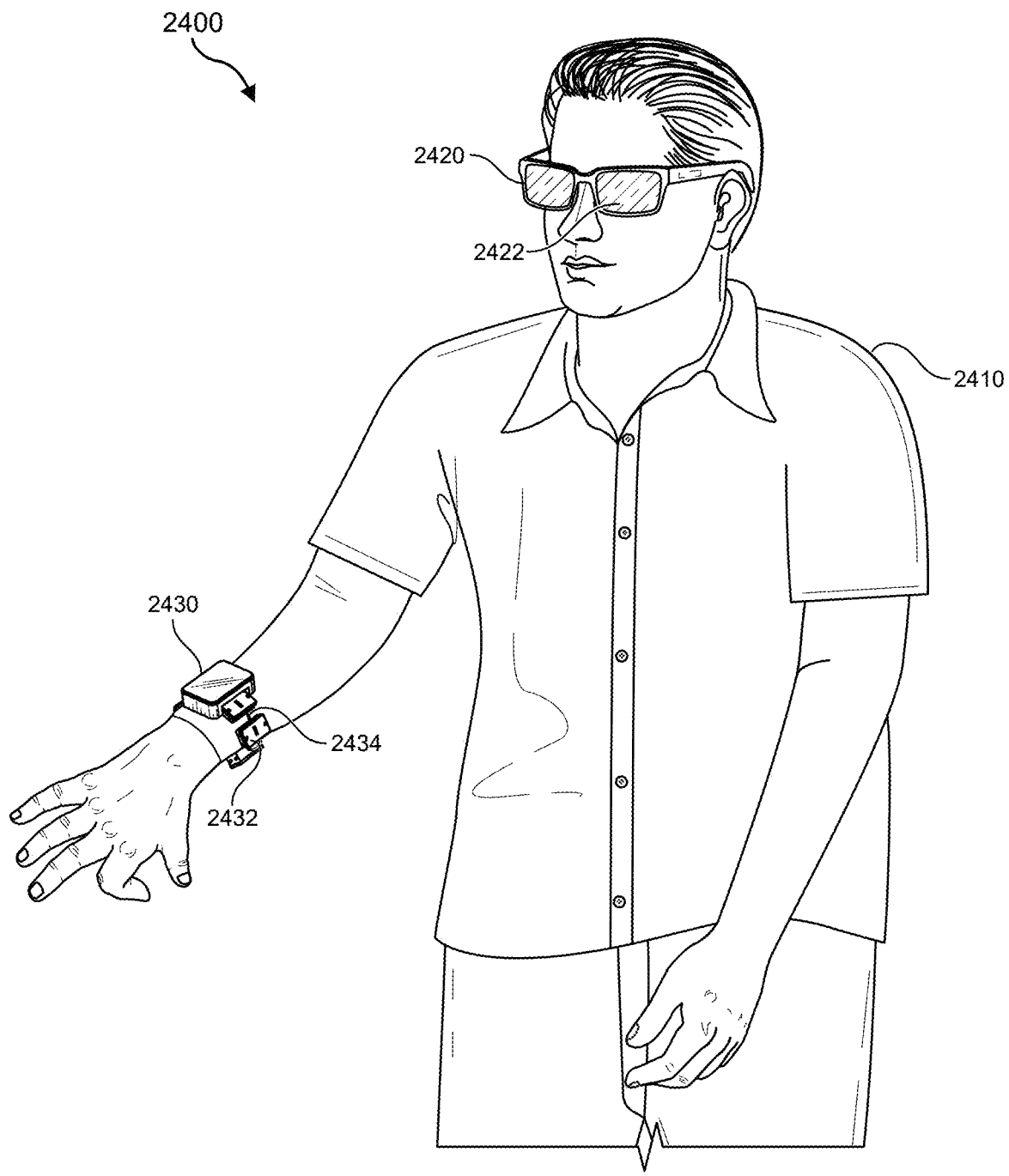
FIG. 24 is an illustration of an exemplary augmented-reality environment according to embodiments of this disclosure.

While haptic interfaces may be used with virtual-reality systems, as shown in FIG. 23, haptic interfaces may also be used with augmented-reality systems, as shown in FIG. 24. FIG. 24 is a perspective view a user 2410 interacting with an augmented-reality system 2400. In this example, user 2410 may wear a pair of augmented-reality glasses 2420 that have one or more displays 2422 and that are paired with a haptic device 2430. Haptic device 2430 may be a wristband that includes a plurality of band elements 2432 and a tensioning mechanism 2434 that connects band elements 2432 to one another.

One or more of band elements 2432 may include any type or form of actuator suitable for providing haptic feedback. For example, one or more of band elements 2432 may be configured to provide one or more of various types of cutaneous feedback, including vibration, force, traction, texture, and/or temperature. To provide such feedback, band elements 2432 may include one or more of various types of actuators. In some embodiments, an actuator may include a layer of a shaped electroactive polymer sandwiched between conductive electrodes. In one example, each of band elements 2432 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 2210, 2220, 2304, and 2430 may include any suitable number and/or type of haptic transducer, sensor, and/or feedback mechanism. For example, haptic devices 2210, 2220, 2304, and 2430 may include one or more mechanical transducers, piezoelectric transducers, and/or fluidic transducers. Haptic devices 2210, 2220, 2304, and 2430 may also include various combinations of different types and forms of transducers that work together or independently to enhance a user's artificial-reality experience. In one example, each of band elements 2432 of haptic device 2430 may include a vibrotactor (e.g., a vibrotactile actuator) configured to vibrate in unison or independently to provide one or more of various types of haptic sensations to a user.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to an electrode that comprises or includes aluminum include embodiments where an electrode consists essentially of aluminum and embodiments where an electrode consists of aluminum.

What is claimed is:

1. An actuator assembly comprising:
   a primary electrode;
   a secondary electrode overlapping at least a portion of the primary electrode;
   an electroactive polymer layer disposed between the primary electrode and the secondary electrode, wherein the electroactive polymer layer comprises a plurality of ribs or pillars and a non-vertical sidewall with respect to a major surface of at least one of the electrodes; and
   a layer of high dielectric constant material located over the primary electrode and between an adjacent pair of the ribs or pillars.

2. The actuator assembly of claim 1, wherein the electroactive polymer layer is at least approximately 90% dense.

3. The actuator assembly of claim 1, wherein the electroactive polymer layer comprises at least one pair of opposing non-vertical sidewalls.

4. The actuator assembly of claim 1, wherein the electroactive polymer layer comprises a plurality of non-vertical sidewalls.

5. The actuator assembly of claim 1, wherein the ribs or pillars are non-axisymmetric.

6. The actuator assembly of claim 1, wherein the primary electrode is disposed over a substrate, the substrate comprising an upwardly-extending mesa between an adjacent pair of the ribs or pillars.

7. The actuator assembly of claim 1, wherein the electroactive polymer layer comprises a first width adjacent to the primary electrode, a second width adjacent to the secondary electrode, and an intermediate width between the primary width and the secondary width, the intermediate width being greater than the primary width and greater than the secondary width.

8. The actuator assembly of claim 1, wherein the non-vertical sidewall comprises a non-planar region.

9. The actuator assembly of claim 1, wherein the non-vertical sidewall comprises a concave region.

10. The actuator assembly of claim 1, wherein the non-vertical sidewall comprises a convex region.

11. The actuator assembly of claim 1, further comprising an adhesive polymer layer disposed between the electroactive polymer layer and at least one of the primary electrode and the secondary electrode.

12. An actuator assembly comprising:
a structured electroactive polymer layer disposed between a primary electrode and a secondary electrode, the structured electroactive polymer layer comprising a plurality of non-axisymmetric ribs or pillars with respect to an axis oriented substantially orthogonal to a major surface of the primary electrode, wherein the primary electrode is disposed over a substrate, the substrate comprising an upwardly-extending mesa between an adjacent pair of the ribs or pillars.

13. The actuator assembly of claim 12, wherein the structured electroactive polymer layer comprises an undercut region.

* * * * *